(12) United States Patent
Mukuta et al.

(10) Patent No.: US 6,889,105 B2
(45) Date of Patent: May 3, 2005

(54) SCHEDULING METHOD AND PROGRAM FOR A SUBSTRATE PROCESSING APPARATUS

(75) Inventors: Nobuhiro Mukuta, Kyoto (JP); Jun Kawai, Kyoto (JP); Kiyoshi Akao, Kyoto (JP); Osamu Horiguchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 88 days.

(21) Appl. No.: 10/141,213

(22) Filed: May 7, 2002

(65) Prior Publication Data

US 2002/0173868 A1 Nov. 21, 2002

(30) Foreign Application Priority Data

| May 16, 2001 | (JP) | 2001-145968 |
| Sep. 10, 2001 | (JP) | 2001-273223 |
| Feb. 15, 2002 | (JP) | 2002-038006 |

(51) Int. Cl.[7] .................................................. G06F 19/00
(52) U.S. Cl. .......................... 700/100; 700/99; 700/121
(58) Field of Search .................. 700/99, 100, 121, 700/95, 97, 105

(56) References Cited

U.S. PATENT DOCUMENTS

| 5,818,716 A | * | 10/1998 | Chin et al. ................... 700/100 |
| 5,838,565 A | * | 11/1998 | Hsieh et al. .................. 700/100 |
| 6,438,436 B1 | * | 8/2002 | Hohkibara et al. ......... 700/100 |
| 6,490,494 B1 | * | 12/2002 | Yasuda ....................... 700/100 |

FOREIGN PATENT DOCUMENTS

JP          8-236491          9/1996

* cited by examiner

Primary Examiner—Leo Picard
Assistant Examiner—Charles Kasenge
(74) Attorney, Agent, or Firm—Ostrolenk, Faber, Gerb & Soffen, LLP

(57) ABSTRACT

A method of preparing a schedule for a substrate processing apparatus. A plurality of lots are processed by the substrate processing apparatus including a plurality of processing sections for processing substrates. An order of processing the lots is determined based on a recipe including a plurality of processing steps for successively processing the lots in the processing sections. The method includes, in determining the processing order, a step of allocating a first processing step for one of the lots, and thereafter allocating, as a next processing step, one of next processing steps for the lots preceded by a processing step having the earliest

18 Claims, 19 Drawing Sheets

Fig.1(PRIOR ART)

| No. | step | preliminary (preparation) | main | subsequent (finishing) |
|---|---|---|---|---|
| 1 | a | 1 | 5 | 1 |
| 2 | b | 1 | 4 | 0 |
| 3 | c | 2 | 5 | 1 |
| 4 | b | 1 | 3 | 0 |
| 5 | d | 2 | 3 | 1 |
| 6 | b | 1 | 4 | 0 |
| 7 | e | 2 | 6 | 0 |

Fig.6

| No. | step | preliminary (preparation) | main | subsequent (finishing) | block |
|---|---|---|---|---|---|
| 1 | a | 1 | 5 | 1 | A |
| 2 | b | 1 | 4 | 0 | A |
| 3 | c | 2 | 5 | 1 | A |
| 4 | b | 1 | 3 | 0 | B |
| 5 | d | 2 | 3 | 1 | B |
| 6 | b | 1 | 4 | 0 | C |
| 7 | e | 2 | 6 | 0 | C | processing of two lots

SCHEDULING METHOD AND PROGRAM FOR A SUBSTRATE PROCESSING APPARATUS

BACKGROUND OF THE INVENTION (1) Field of the Invention

The present invention relates to a scheduling method and program for a substrate processing apparatus that performs predetermined processes on semiconductor wafers or glass substrates for liquid crystal displays (which will be referred to hereinafter simply as substrates).

(2) Description of the Related Art

A conventional scheduling method for such a substrate processing apparatus may be the event drive type that performs one process after another.

One lot of substrates is processed according to a predetermined recipe as shown in the table of FIG. 1, which includes seven processing steps "a" to "e", for example.

With this recipe, the processing steps are executed in the order of a, b, c, b, d, b and e. Each processing step in this example is divided into three operations of "preliminary operation", "main operation" and "subsequent operation". The numerals in the table of FIG. 1 exemplify processing times (minutes) of the operations in the processing steps "a" to "e". Broadly, what is done in each processing step is as follows, for example. The processing step "a" is to take substrates out of a cassette and prepare the substrates for transportation. The processing step "b" is to transport the substrates. The processing step "c" is to apply a chemical to the substrates and clean the substrates with deionized water. The processing step "d" is to dry the substrates. The processing step "e" is to transport the substrates and deposit the substrates in a cassette.

The table of FIG. 1 purports the following particulars also.

The processing step "a" completes a preliminary operation in one minute, then processes one lot of substrates in a main operation which takes five minutes, and performs a one-minute subsequent operation. The processing step "b" completes a preliminary operation in one minute, and processes the one lot of substrates in a main operation which takes four minutes, with no subsequent operation. The processing step "c" completes a preliminary operation in two minutes, then processes the one lot of substrates in a main operation which takes five minutes, and performs a one-minute subsequent operation. The processing step "b" executed a second time performs a one-minute preliminary operation and a three-minute main operation. The processing step "d" performs a two-minute preliminary operation, a three-minute main operation and a one-minute subsequent operation. The processing step "b" executed a third time performs a one-minute preliminary operation and a four-minute main operation. The processing step "e" performs a two-minute preliminary operation and a six-minute main operation.

FIG. 2 shows a time chart of the processes performed on one lot of substrates according to the recipe shown in FIG. 1.

Upon completion of the main operation in the processing step "a", a completion signal "e" is outputted (as indicated by an ordinary arrow) to a processing unit that executes the next processing step "b". Only at this point of time does the processing unit start the preliminary operation in the processing step "b". The substrates are actually transferred to the processing step "b" at a point of time referenced "m" (indicated by a black triangular arrow). Similarly, after a completion signal "e", the lot is actually transferred to each subsequent processing step at a point of time "m".

FIG. 3 shows a time chart of a successive processing of two lots by the above event drive type. In FIG. 3, the white rectangles represent the first lot, and the hatched rectangles the second lot. Thus, completion of the main operation in each processing step is notified to the next processing step, whereupon a preliminary operation is started, and substrates are actually transferred when the preliminary operation is completed.

The conventional practice noted above has the following drawback.

According to the conventional scheduling method noted above, upon completion of a main operation, the completion is notified to a next processing step, and then a preliminary operation in the next processing step is started. Since the processing is performed in this way, numerous standby periods (black portions) occur as shown in the time chart of FIG. 3. Thus, each processing unit of the substrate processing apparatus has markedly low time efficiency.

Where the substrate processing apparatus includes a chemical processing unit using a processing or treating solution, the treating solution must be changed regularly according to the life of the treating solution, i.e. "lifetime" based on use time of the treating solution and "life count" based on use frequency of the treating solution.

In the conventional substrate processing apparatus, therefore, transport of a new lot from a loading section is stopped on information that the life count or lifetime is up. Then, when no lot remains to be processed in the chemical processing unit, an operation is carried out to change the treating solution.

This conventional practice has the following drawback.

When a lot is present in the conventional substrate processing apparatus and the recipe requires use of the chemical processing unit, a processing has to be continued until this lot is processed even though the treating solution is depleted. In other words, priority is afforded to the processing of a lot, which tends to delay changing of the treating solution. This brings about a failure to change the solution according to the lifetime or life count.

The above failure in timely changing of the solution results in a processing with the depleted treating solution. This could lower repeatability of the processing or cause a defective processing.

SUMMARY OF THE INVENTION

The present invention has been made having regard to the state of the art noted above, and its object is to provide a scheduling method for a substrate processing apparatus, in which standby time is reduced to improve time efficiency of the substrate processing apparatus by preparing a schedule based on a recipe before starting processes.

Another object of the present invention is to provide a scheduling method and program for a substrate processing apparatus, in which a treating solution may be changed accurately according to a lifetime or life count thereof by giving priority to changing of the treating solution according to the life of the solution.

The above objects are fulfilled, according to the present invention, by a method of preparing a schedule for a substrate processing apparatus, wherein a plurality of lots are processed by the substrate processing apparatus including a plurality of processing sections, an order of processing the lots being determined based on a recipe including a plurality of processing steps for processing the lots in the processing sections, the method comprising, in determining the order, a step of allocating a first processing step for one of the lots, and thereafter allocating, as a next processing step, one of next processing steps for the lots preceded by a processing step having an earliest expected completion time.

A schedule is prepared in advance by allocating a processing step for one of the lots, and thereafter allocating, as a next processing step, one of next processing steps for the lots preceded by a processing step having an earliest expected completion time. By so scheduling in advance, a subsequent operation in the preceding processing step and a preliminary operation in the succeeding processing step may be overlapped. By selecting and allocating, with priority, a processing step preceded by a processing step completed early, as the next processing step, this next processing step may be completed in a reduced time. Thus, effectively use is made of each processing section of the substrate processing apparatus and the standby time is reduced to improve time efficiency.

Preferably, the one of next processing steps for the lots preceded by a processing step having the earliest expected completion time is prevented from being allocated after a processing step already allocated and having an expected transfer time remaining open, the expected transfer time being a time at which a processed lot is transferred.

A processing step having been completed but its expected substrate transfer time remains undecided, usually, is a process in which the processed lot may be left on standby. Thus, there may be no restriction as to the time by which the next processing step must be executed. The expected transfer time remains open until the next processing step is allocated. Since the time when the processing section used for the processing step concerned becomes available is undecided, no processing step should be allocated after this processing step. In this way, processing steps for each lot may be allocated without affecting the schedule of the lots already allocated.

In another aspect of the invention, a method of preparing a schedule for a substrate processing apparatus is proved, wherein a plurality of lots are processed by the substrate processing apparatus including a plurality of processing sections, an order of processing the lots being determined, before an actual processing, based on a recipe including a plurality of processing steps for processing the lots in the processing sections, the method comprising, in determining the order: when a first processing step for one of the lots is allocated and thereafter a processing step for a next lot is allocated, and a processing step for the next lot allocated later overtakes and precedes in time a processing step for the one of the lots allocated earlier, subsequent processing steps of the next lot becoming impossible to allocate; a step of determining an allocating position to which each processing step for the next lot is allocable, regarding the allocating position as a positive allocating position, determining, as a scheduling time difference, a difference between a time of the positive allocating position and a scheduling reference time of a scheduling reference position for processing steps being allocated, obtaining step times by dividing the scheduling time difference by a predetermined value, and trying an allocation of each processing step for the next lot for each of the step times starting with the scheduling reference time.

When an "overtaking" takes place, with a processing step for the next lot allocated later precedes a processing step for the lot allocated earlier, and subsequent processing steps for the next lot becoming impossible to allocate, an effort is made to search a position for allocating each processing step for the next lot. A difference is determined, as a scheduling time difference, between the time in this positive allocating position and a scheduling reference time in a schedule standard position (which time is later than current time and is a time for starting execution of what is being scheduled). This scheduling time difference reflects a current scheduling situation. The scheduling time difference is divided by a predetermined value to obtain step times. A trial is made for each step time reflecting the current scheduling situation, starting with the scheduling reference time, to allocate the processing step for the next lot. Thus, a trial of allocation is performed broadly for each step time variable with the situation. As a result, the time required for the scheduling may be shortened regardless of the situation.

In a further aspect of the invention, a method of preparing a schedule for a substrate processing apparatus is proved, the substrate processing apparatus including a plurality of processing sections, use timing of resources in the processing sections being determined to process the plurality of lots with the resources, the method comprising:

with a view to using the processing sections based on a lifetime determining life of the treating solution from use time of the treating solution in the processing sections and a life count determining life of the treating solution from use frequency of the treating solution in the processing sections;

a step of allocating solution change plans according to the lifetime to the resources in the processing sections before starting an actual processing, thereafter allocating times for using each of the resources for each of the lots, and when the life count expires, canceling those of the solution change plans according to the lifetime already allocated after expiry of the life count, allocating a solution change plan immediately after the expiry of the life count, and thereafter allocating times for using each of the resources for each of the lots again.

Solution change plans according to the lifetime to the resources in the processing sections are first allocated, and then times for using each of the resources for each of the lots are allocated so as to fit into intervals between the solution change plans. This arrangement enables the solution to be changed faithfully to its lifetime. When the life count expires in the course of allocating the times for the lots to use the resources, subsequent solution change plans according to the lifetime are canceled, and a solution change plan is allocated immediately after the expiry of the life count. Thus, the solution may be changed immediately after the expiry of the life count. The solution may be changed accurately by allocating changing of the solution with priority as above.

The resources in the present invention include, for example, transport mechanisms for transporting substrates, deionized water cleaning units for cleaning the substrates with a treating solution including deionized water, hot water units for supplying heated deionized water, chemical processing units for processing the substrates with a treating solution including chemicals, and heating units for heating the substrates.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 1 is a table showing one example of recipe;

FIG. 6 is a table showing one example of recipe in the first embodiment;

DESCRIPTION OF THE PREFERRED EMBODIMENTS

Preferred embodiments of the present invention will be described in detail hereinafter with reference to the drawings.

First Embodiment

Figure 4:
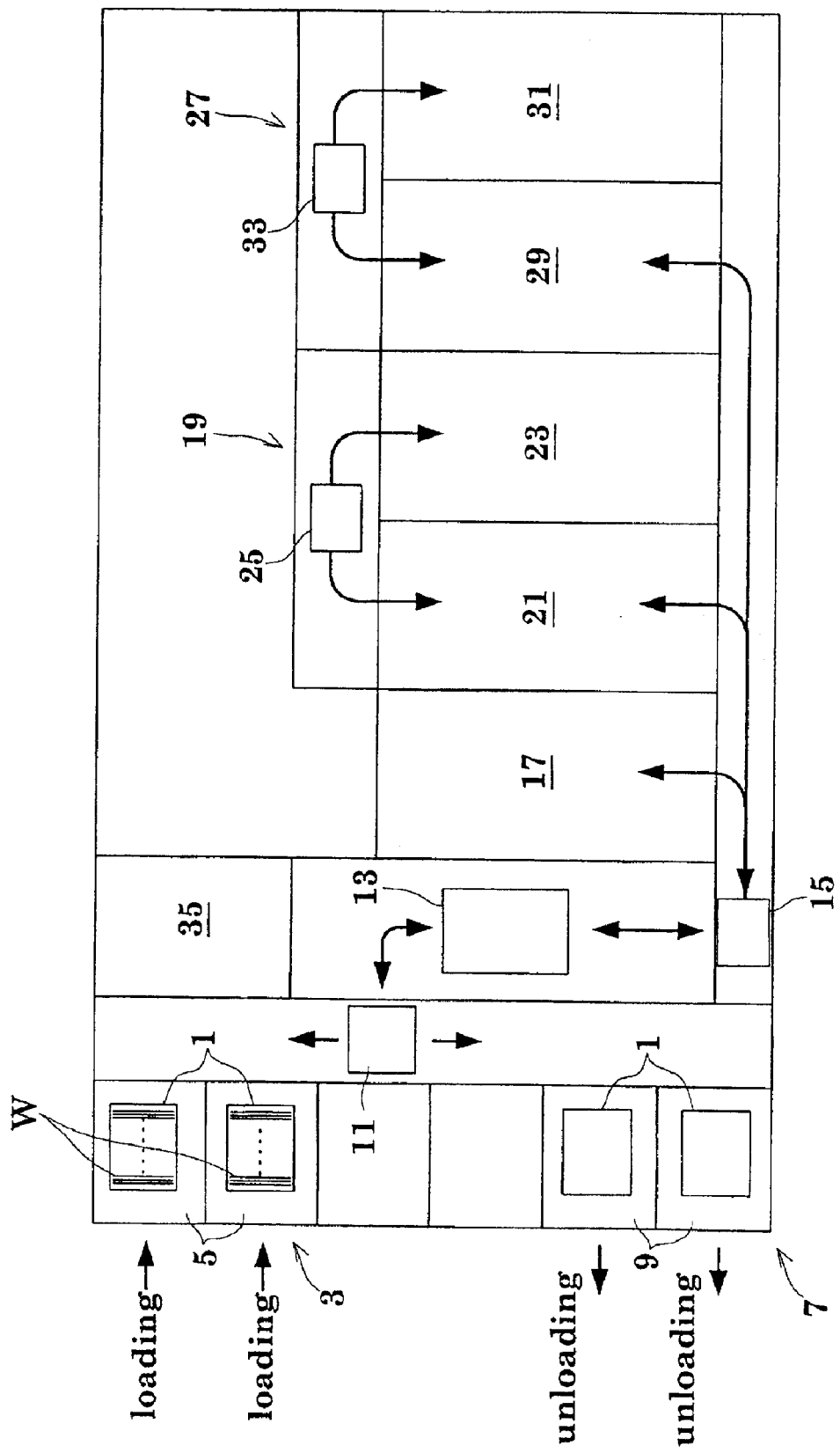
FIG. 4 is a plan view showing an outline of a substrate processing apparatus in a first embodiment.
Figure 5:
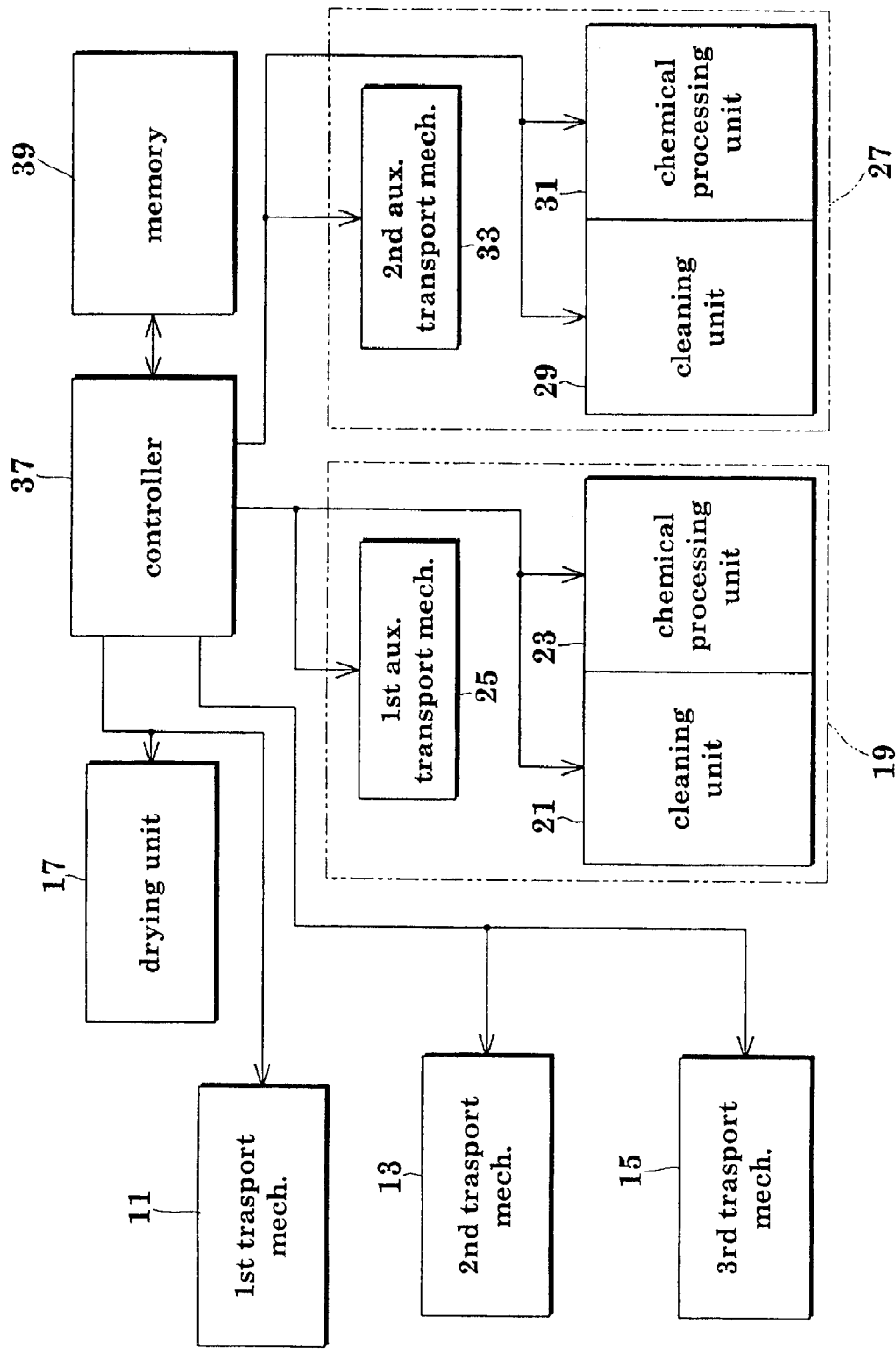
FIG. 5 is a block diagram of the substrate processing apparatus in the first embodiment.

FIGS. 4 and 5 show one embodiment of the present invention. FIG. 4 is a plan view showing an outline of a substrate processing apparatus in this embodiment. FIG. 5 is a block diagram of the apparatus.

This substrate processing apparatus performs a chemical processing on wafers W, for example. A plurality of (e.g. 25) wafers W are stored in vertical posture in each cassette 1. Cassettes 1 containing wafers W to be processed are placed in a loading section 3. The loading section 3 includes two support tables 5 for receiving the cassettes 1. An unloading section 7 is disposed opposite the loading section 3 across a middle portion of the substrate processing apparatus. The unloading section 7 is used for delivering processed wafers W as stored in cassettes 1. As does the loading section 3, the unloading section 7 includes two support tables 9 for receiving the cassettes 1.

In an area extending along the loading section 3 and unloading section 7 is a first transport mechanism 11 movable between these sections. The first transport mechanism 11 transports each cassette 1 containing the plurality of wafers W from the loading section 3 to a second transport mechanism 13.

The second transport mechanism 13 takes all the wafers W out of the cassette 1, and transports all the wafers W to a third transport mechanism 15. The second transport mechanism 13 also receives processed wafers W from the third transport mechanism 15, deposits the wafers W in a cassette 1, and transports the cassette to the first transport mechanism 11.

The third transport mechanism 15 is constructed movable longitudinally of the substrate processing apparatus. A drying unit 17 is disposed in the most upstream position with respect to the direction of movement of the third transport mechanism 15, for drying a plurality of wafers W placed in a low-pressure chamber.

A first processing section 19 is disposed next to the drying unit 17 in the direction of movement of the third transport mechanism 15. A second processing section 27 is disposed next to the first processing section 19.

The first processing section 19 includes a deionized water cleaning unit 21 for cleaning a plurality of wafers W with deionized water, and a chemical processing unit 23 for applying a chemical solution to the plurality of wafers W. The first processing section 19 further includes a first auxiliary transport mechanism 25 for transferring the plurality of wafers W only between the cleaning unit 21 and chemical processing unit 23.

The second processing section 27 has the same construction as the first processing section 19. That is, the second processing section 27 has a deionized water cleaning unit 29, a chemical processing unit 31 and a second auxiliary transport mechanism 33.

A cassette cleaning unit 35 associated with the second transport mechanism 13 has a function to clean the empty cassette 1 after the second above transport mechanism 13 takes all the wafers W out of the cassette 1.

The first transport mechanism 11, second transport mechanism 13, third transport mechanism 15, first processing section 19 and second processing section 27 correspond to the processing sections of the present invention.

The substrate processing apparatus having the above construction is controlled overall by a controller 37 as shown in the block diagram of FIG. 5.

The controller 37 includes a CPU and the like for preparing a schedule beforehand by a scheduling program including rules as described hereinafter, and thereafter controlling the respective sections to provide processes according to a predetermined recipe while controlling the respective sections based on the schedule to process a plurality of lots. The schedule has processing steps for each lot arranged in a time series, and is prepared in advance of an actual processing of the wafers W.

A memory 39 stores recipes prepared by the user of the substrate processing apparatus and including a plurality of processing steps determining how the wafers W should be processed, the scheduling program, and a processing program for executing the schedule prepared. The schedule prepared also is stored in the memory 39.

"Basic Rule"

A first processing step for one of the lots is allocated first. Then, an "expected completion time" of a processing step preceding a next processing step of each lot is determined. The processing step for the lot preceded by a processing step having the earliest completion time is allocated as the next processing step.

Besides the above "basic rule", a number of other rules should preferably be contemplated as follows, for example:

"Rule A"

No step is allocated after a processing step at an expected transfer time.

Assume that a time at which a processed lot is transferred is called "expected transfer time". A processing step, even for a lot having the earliest "expected transfer time", is not allocated after a processing step having an expected transfer time remaining open.

"Rule B"

A next processing step is allocated within a permissible time.

Although a processing time is determined beforehand for a processing in each processing section, no problem may arise from a certain standby period from the end of the processing to a next processing step. In a transporting process, for example, wafers W may be put on standby after being taken out of a cassette 1. In a cleaning process, wafers W may stand by in deionized water. In a drying process, there is no problem in leaving dried wafers W on standby. However, a standby period should be kept within bounds; an excessively long standby could have an adverse effect upon the wafers W. Thus, the longest limit is set to be "permissible time", and a next processing step is allocated within the "permissible time".

"Rule C"

Priority is given to an overtaking lot.

The term "overtaking" is used herein to mean a case where a processing step for a lot allocated later precedes in time a processing step for a different lot allocated earlier. In the event of an "overtaking", a processing step for an overtaking lot is allocated with priority.

An example of successively processing two lots by the same recipe will be described next.

The processing is carried out by the substrate processing apparatus described above. To facilitate understanding, the recipe is a simplified version of an actual recipe as shown in the table of FIG. 6. That is, although the above substrate processing apparatus includes the first processing section 19 and second processing section 27, this recipe does not use the second processing section 27.

The recipe includes processing step "a" to processing step "e", part of which is executed a plurality of times to make a total of seven processing steps. The whole processing is divided into three blocks A–C by processing steps having the above permissible time.

Block A includes the processes in which the first transport mechanism 11 fetches a cassette 1 from the loading section 3, the second transport mechanism 13 takes a lot (i.e. a plurality of wafers W) out of the cassette 1, the chemical processing unit 21 of the first processing section 19 applies the chemical solution to the lot, and the cleaning unit 23 cleans the lot. The empty cassette 1 is cleaned in the cassette cleaning unit 35 in the meantime, which is omitted from consideration.

Specifically, in the processing step "a", the first transport mechanism 11 fetches a cassette 1 from the loading section 3, and passes the cassette 1 on to the second transport mechanism 13, and the second transport mechanism 13 takes the plurality of wafers W constituting a lot out of the cassette 1. In the processing step "b", the third transport mechanism 15 receives the lot, and stands by in a predetermined position. In the processing step "c", the first processing section 19 receives the lot from the third transport mechanism 15, cleans the lot with deionized water in the cleaning unit 21, transports the lot with the auxiliary transport mechanism 25 to the chemical processing unit 23 for a chemical process, and thereafter transports the lot again with the auxiliary transport mechanism 25 to the cleaning unit 21 for a cleaning process with deionized water. The numerals in the table of FIG. 6 exemplify processing times (minutes) of preliminary operations, main operations and subsequent operations.

Block B includes the processes in which the third transport mechanism 15 fetches the processed lot from the cleaning unit 21 and transports the lot to the drying unit 17 for a drying process.

Specifically, in the processing step "b", the third transport mechanism 15 receives the cleaned lot, and stands by in a predetermined position. In the processing step "d", the third transport mechanism 15 transports the lot to the drying unit 17, and the lot is dried therein through a drying process.

Block C includes the processes in which the third transport mechanism 15 fetches the dried lot, the second transport mechanism 13 deposits the lot in a cassette 1, and the first transport mechanism 11 transports the cassette 1 to the unloading section 7.

Specifically, in the processing step "b", the third transport mechanism 15 receives the dried lot, and stands by in a predetermined position. In the processing step "e", the second transport mechanism 13 receives the lot, deposits the plurality of wafers W in the cassette 1, and passes the cassette 1 to the first transport mechanism 11 which transports the cassette 1 to the unloading section 7 for delivery.

The last processing steps in blocks A and B, i.e. the processing step "c" and processing step "d", have permissible times, so that certain time gaps are allowed before the next processes without having to pass the lot to the next processes promptly.

The successive processing of two lots by the same recipe will be described next with reference to FIGS. 7 through 14.

Figure 7:
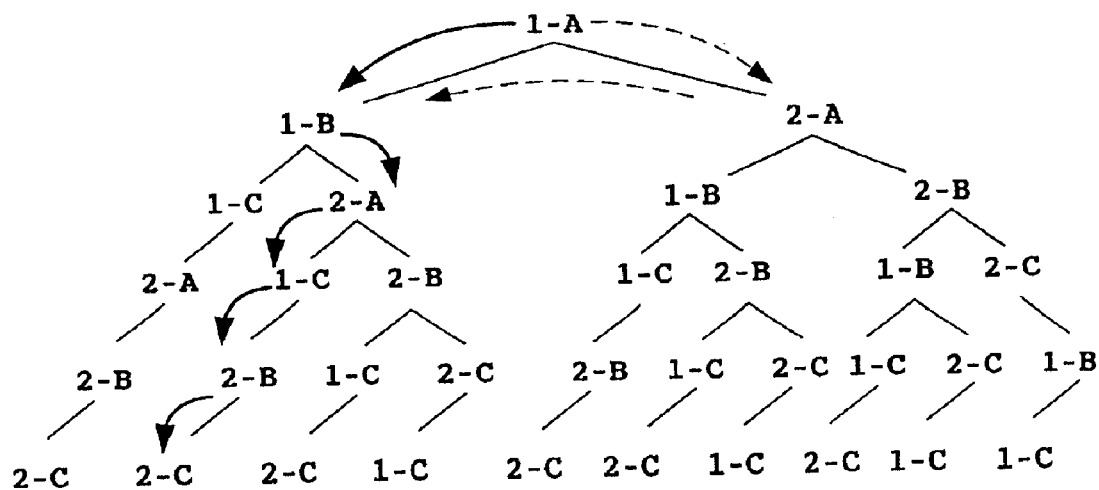
FIG. 7 is a view showing an example of combination for scheduling.

FIG. 7 is a view showing an example of scheduling combination. FIGS. 8 through 14 are time charts showing scheduling stages. In FIGS. 7 through 14, the processing steps are indicated by references in the form of "lot-block". That is, reference "1-A" in FIG. 7 represents a processing step in block A for the first lot.

First, the controller 37 determines which of the two lots to schedule first.

For simplicity, the first lot is scheduled first. In this case, as shown in the scheduling time chart of FIG. 8, block A for the first lot is allocated to a reference time. With a schedule prepared in this way beforehand, as distinct from the event drive type in the prior art, the processing steps are arranged such that, upon completion of the main operation in a preceding processing step, the main operation of a next processing step is started. That is, a lot is transferred (as referenced "m") at a point of time a completion signal e is outputted. The point of time the main operation is completed will be referred to hereinafter as the expected transfer time.

With block A for the first lot (referenced 1-A) of the two lots allocated as noted above, the next item to be selected is, as seen from the combination in FIG. 7, either block B for the first lot or block A for the second lot.

The controller 37 first arranges these blocks A and B on the time chart for trial.

Figure 8:
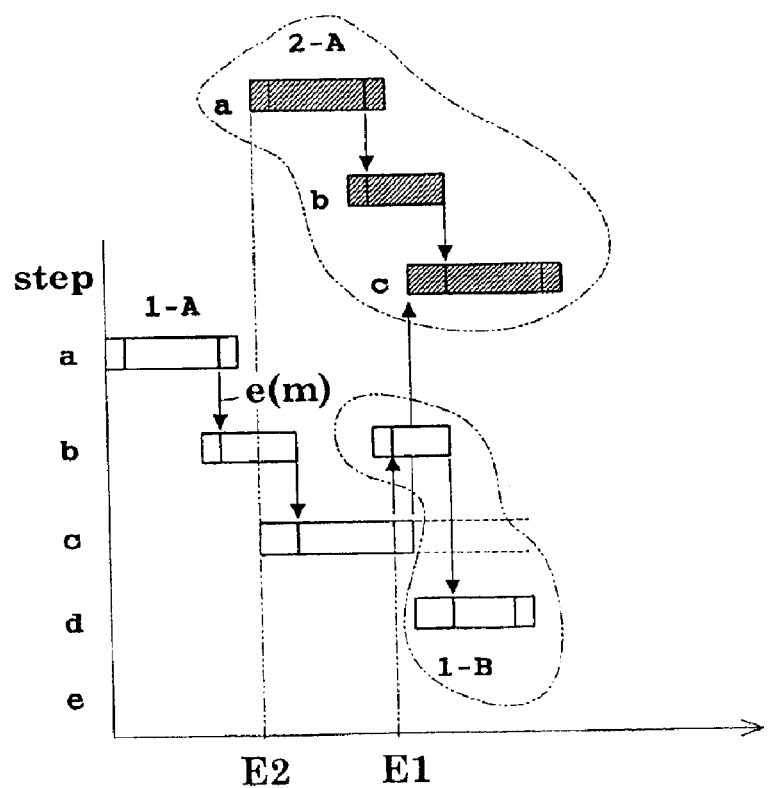
FIGS. 8 through 14 are time charts showing scheduling stages.

In this example, as shown in FIG. 8, block B for the first lot is set to the expected transfer time of block A for the first lot, and block A for the second lot is set for its processing step "c" to be adjacent the processing step "c" for the first lot. Then, a comparison is made between expected completion times of preceding processing steps, i.e. between expected completion time E1 of block A for the first lot and expected completion time E2 of a processing step preceding block A for the second lot. This example provides no processing step preceding block A for the second lot. Thus, an expected starting time of block A is assumed to be the expected completion time. As a result, the expected completion time E2 of the second lot is the earlier, and so block A for the second lot is to be selected.

However, even though the expected completion time E2 of the processing step preceding the second lot is the earlier, rule A noted above is applied whereby block B for the first lot will be allocated instead of block A for the second lot.

That is, the processing step "c" in block A for the first lot has a permissible time, and therefore this processing step "c" has a possibility of extension as shown in dotted lines in FIG. 8. This processing step "c" has an expected lot transfer time remaining open. Since the time the first processing section 19 used for the processing step "c" becomes available is undecided, it is undesirable to allocate, after block A for the first lot, block A for the second lot including the processing step "c" that uses the first processing section 19. Rule A is provided to avoid such an allocation.

After block B for the first lot (referenced 1-B) is allocated, the next processing step to be allocated, from the combination in FIG. 7, is either block C for the first lot or block A for the second lot.

Figure 9:
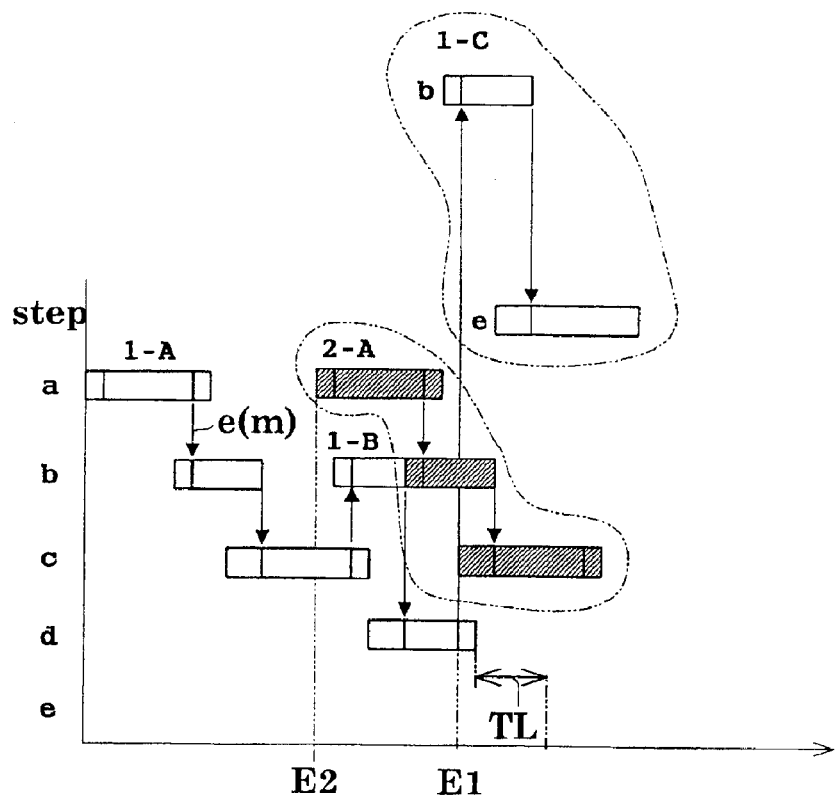

As noted above, these blocks are arranged on the time chart for trial (see FIG. 9).

A comparison is made between the expected completion time E1 of block B for the first lot which is the preceding processing step and the expected completion time E2 of the processing step preceding block A for the second lot (i.e. expected starting time of block A for the reason noted above). As a result, the second lot is found the earlier, and block A for the second lot is set for its processing step "b" to be adjacent the processing step "b" for the first lot.

FIG. 9 shows permissible time TL in the processing step "d" only for the first lot.

Figure 10:
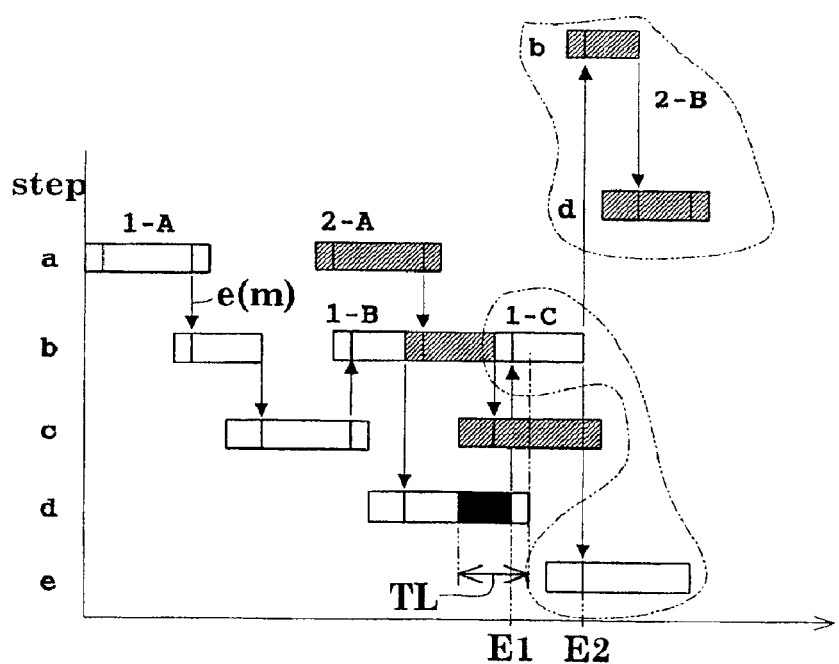
Figure 11:
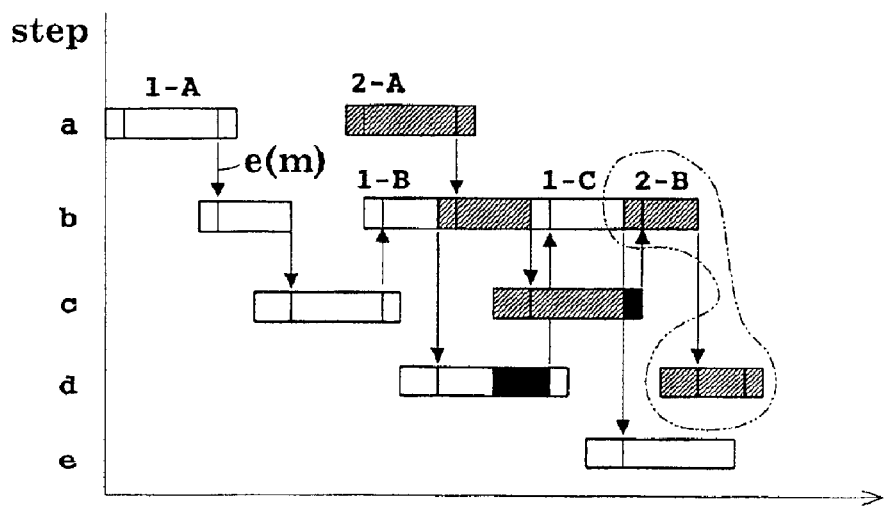
Figure 12:
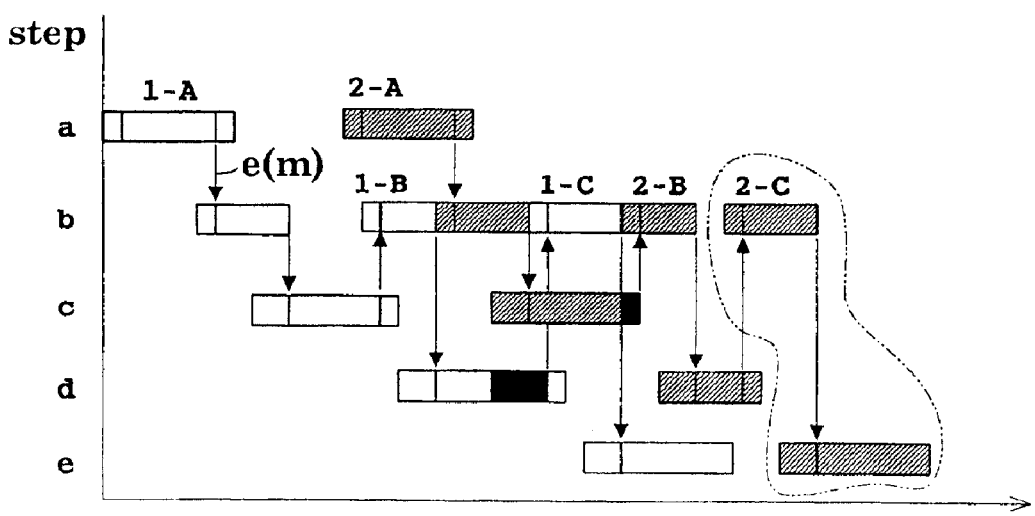

Next, from the combination in FIG. 7, block C for the first lot and block B for the second lot are allocated for trial (see FIG. 10). From a result of comparison between expected completion times E1 and E2 of the preceding processing steps (1-B and 2-A), block C for the first lot is allocated.

A hypothetical case of expected completion time E2 of the second lot being the earlier will be described.

In this case, block B for the second lot is allocated. Then, block C for the first lot would exceed the permissible time TL allowed for the processing step "d" for the first lot, which would cause an adverse effect on the first lot. This is avoided by applying rule B noted above. That is, block C of the first lot is allocated with priority to perform the next processing step "b" not to exceed the permissible time TL set to the processing step "c" for the first lot.

Figure 13:
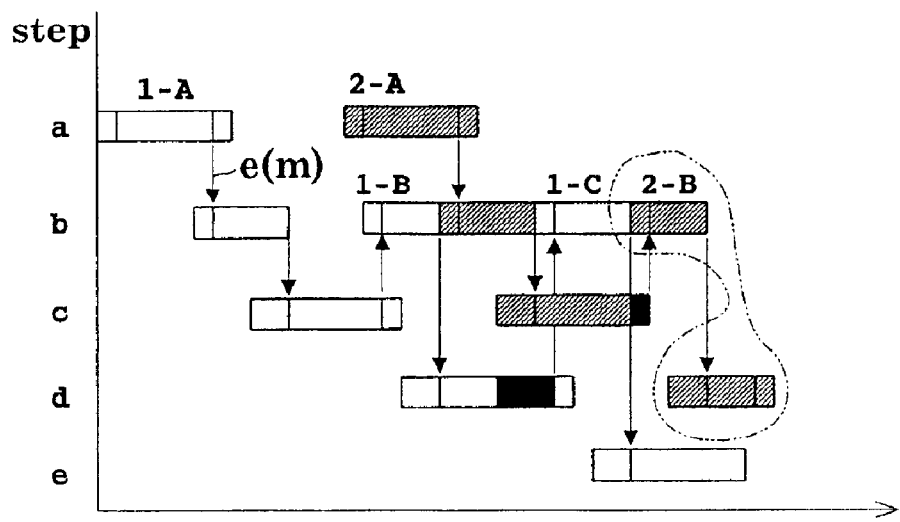
Figure 14:
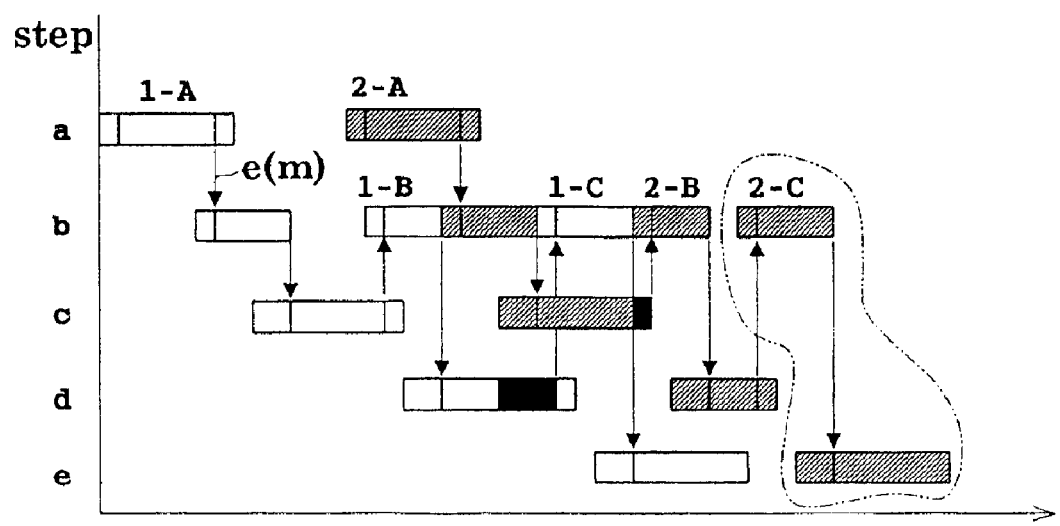

Next, based on the combination in FIG. 7, block B for the second lot is allocated (see FIG. 13). Finally, block C for the second lot is allocated (see FIG. 14) to complete the schedule. The schedule prepared is stored in the memory 39 for reference by the processing program during an actual processing. The stages of preparation described above are indicated by arrows in dotted lines and solid lines in FIG. 7.

Figure 2:
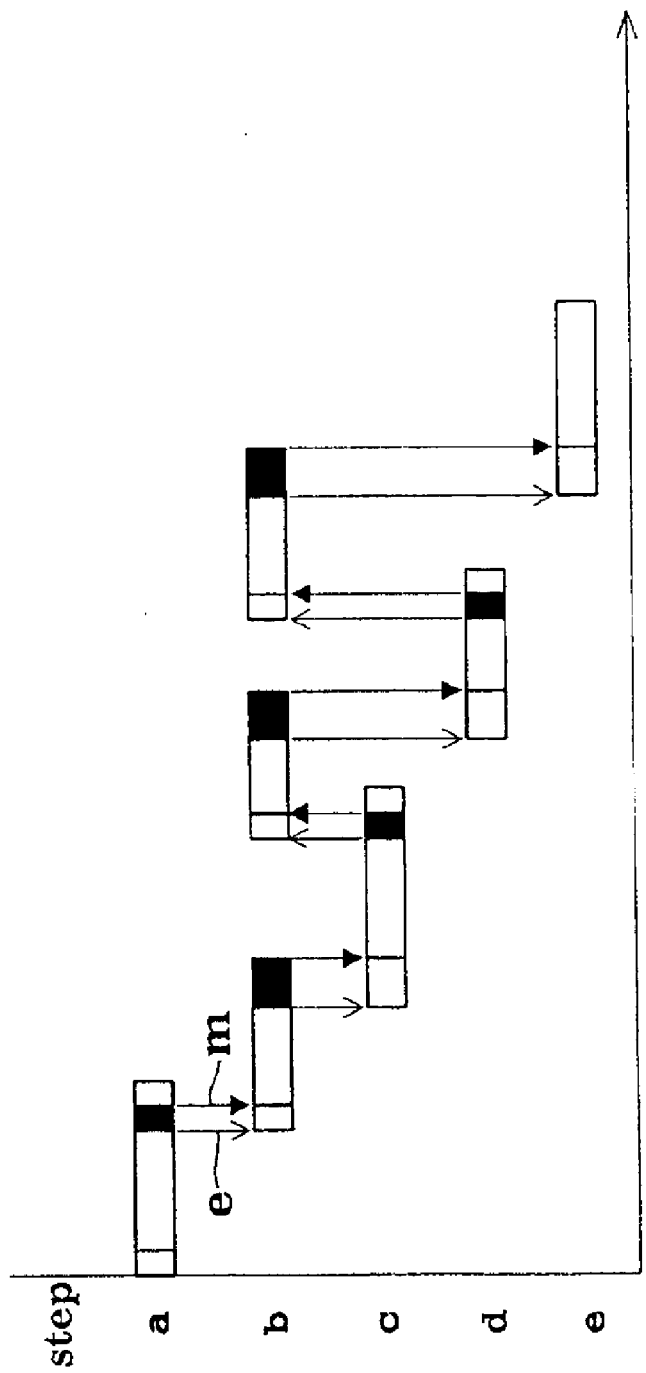
FIG. 2 is a time chart showing a processing of one lot in the prior art.
Figure 3:
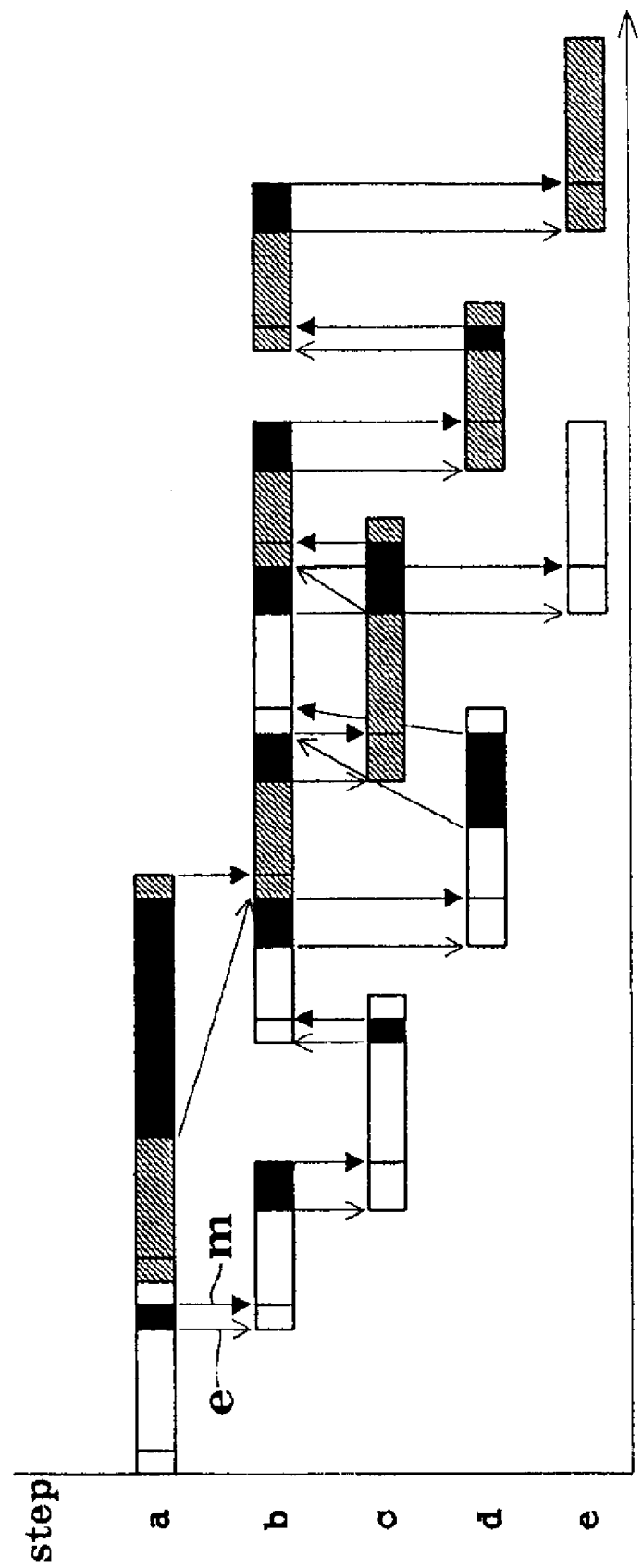
FIG. 3 is a time chart showing a processing of two lots in the prior art.

It will be seen that the schedule prepared in this way provides a greatly reduced standby time (black portions in the drawings) compared with the conventional example (FIG. 3). By preparing the schedule by the above rules beforehand, the subsequent operation in a preceding processing step and the preliminary operation in a succeeding processing step may be allocated to overlap each other. Of the allocable processing steps, a processing step for a lot with a preceding processing step ending earlier is allocated as a next processing step, thereby to shorten time until the next processing step is completed. Thus, effectively use is made of each processing section of the substrate processing apparatus and the standby time is reduced to improve time efficiency.

Further, "rule A" is adopted to allocate no processing step after a processing step with an expected lot transfer time remaining open. Thus, the processing steps for each lot may be allocated without affecting the schedule of a lot already determined.

"Rule B" is adopted to allocate a processing step within a permissible time, if any, allowed for a preceding processing step. The processes may thereby be performed substantially faithfully to the recipe, while suppressing an adverse effect on the lots.

In the above scheduling method, a processing step for one of the lots is first allocated, and then a processing step for a next lot is allocated. An "overtaking" may occur in which a processing step for the next lot may precede a processing step for the lot allocated earlier, and subsequent processing steps for the next lot may become impossible to allocate. In such a case, it is preferable to make the following attempt in scheduling.

As a natural measure to be taken in such a case, from a scheduling reference time in a scheduling reference position for a processing step being allocated, an attempt is made a predetermined number of times at predetermined intervals to allocate a next processing step for the lot concerned. For example, the allocation is tried five times at intervals of one minute.

However, such a measure has the following inconveniences.

Since the trial is made only the predetermined number of times at the predetermined intervals, the predetermined number of times alone could fail to complete the schedule. A substantial increase in the number of times may results in a long time consumed to complete the schedule.

An example of applying "rule C" will particularly be described now with reference to FIGS. 15 through 19. FIGS. 15 through 19 are time charts showing scheduling stages involving an "overtaking".

In these time charts, the origin represents current time, and sign "x" corresponds to a scheduling reference position for each processing step being allocated and represents a scheduling reference time. This means that the following schedule concerning an overtaking cannot be completed unless scheduling is completed within a period from the origin to the time "x". The period between the scheduling reference time "x" and current time, essentially, reduces with the passage of time. However, for expediency of illustration, this period is fixed in FIGS. 15 through 19.

Figure 15:
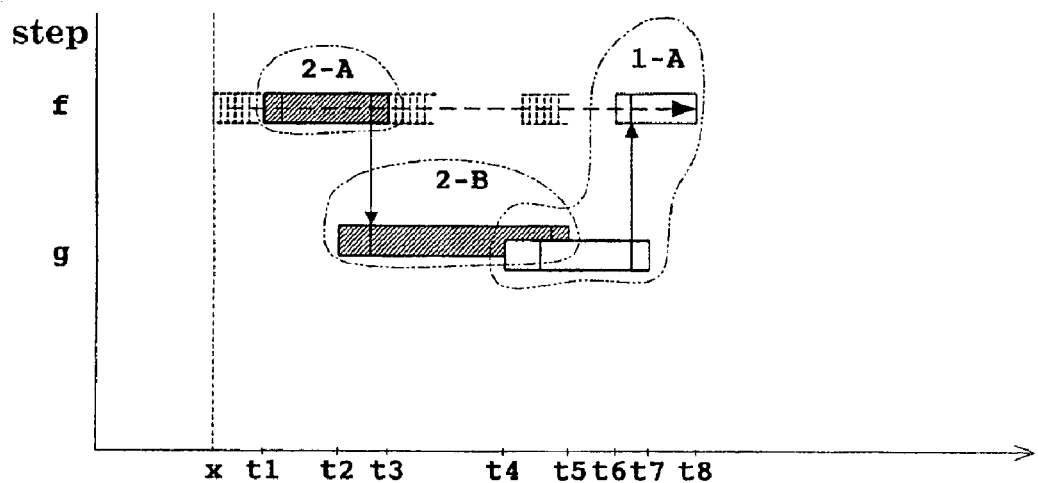
FIGS. 15 through 19 are time charts showing scheduling stages involving an overtaking.

Assume, as shown in FIG. 15, for example, that block A including processing steps "g" and "f" for the first lot is allocated to a period from time t4 to time t7 and a period from time t6 to t8 (as referenced 1-A). Assume also that block A including processing step "f" for the second lot is next allocated to a period from time t1 to time t3 (as referenced 2-A). Thus, block A for the second lot precedes in time block A for the first lot. That is, an "overtaking" as defined in this specification takes place. Assume further that block B including processing step "g" following block A for the second lot is allocated to a period from time t2 to time t5. In such a case, block A for the second lot is allocated with priority. By adopting this rule C, as in the case of the basic rule, each processing section of the substrate processing apparatus may be used to maximum.

However, in the processing step "g", block A for the first lot and block B for the second lot are in conflict with each other. This situation, as it is, renders the schedule inconclusive. As a solution, the following measure is taken.

Figure 16:
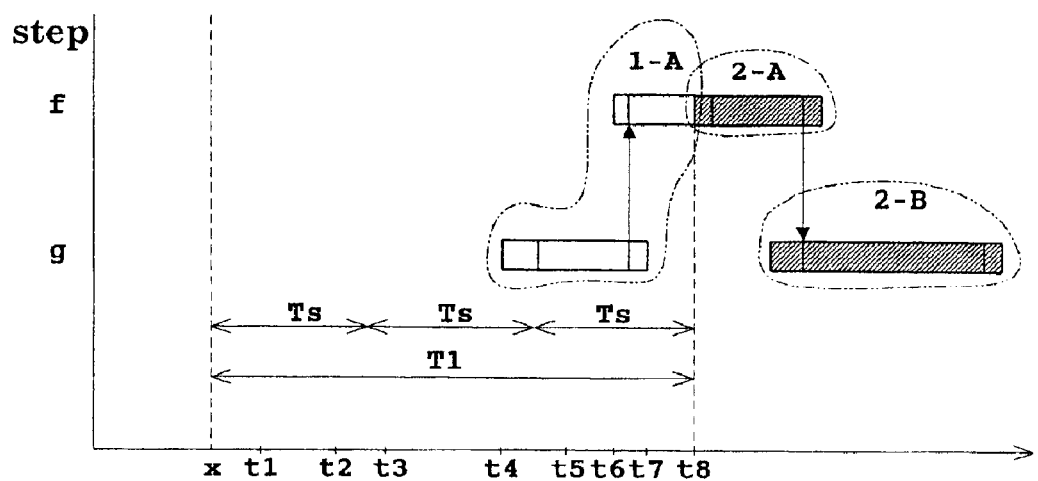

First, as shown in FIG. 16, a search is made for positions for allocating block A for the first lot and block B for the second lot reliably without conflict with each other and with other lots. Specifically, block B for the second lot may be allocated immediately after the processing step "f" in block A for the first lot, for example. With this position regarded as a "positive allocating position", a difference is determined between time t8 of this allocating position of block B for the second lot and the scheduling reference time "x". The difference obtained is regarded as scheduling time difference T1. Then, a predetermined value "n" is read from the memory 27, and the scheduling time difference T1 is divided by the predetermined value "n". To facilitate understanding, the predetermined value "n" is assumed to be "3" here.

Step times Ts are derived from the division of the scheduling time difference T1 by the predetermined value n=3. A trial is made for each step time Ts starting with the scheduling reference time "x" to determine whether block A and block B for the second lot are allocable or not. In other words, the trial is repeated the number of times corresponding to the predetermined value "n". During this trial, preferably, the position of each processing step for the first lot should remain fixed for stability of its scheduling.

Figure 17:
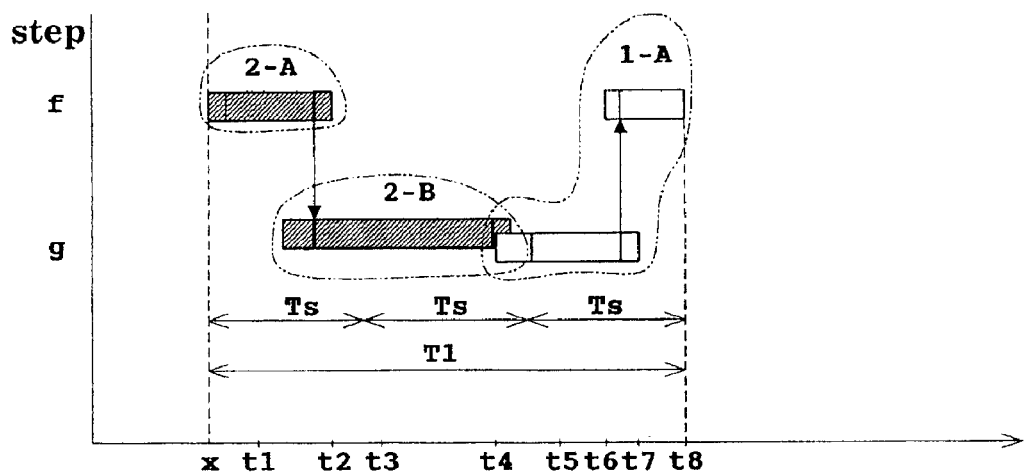

FIG. 17 shows block A for the second lot set to the scheduling reference time "x". In this case, however, it will be seen that block B for the second lot subsequently allocated will conflict with the processing step "f" for the first lot. Thus, this position is not suitable for allocation.

Figure 18:
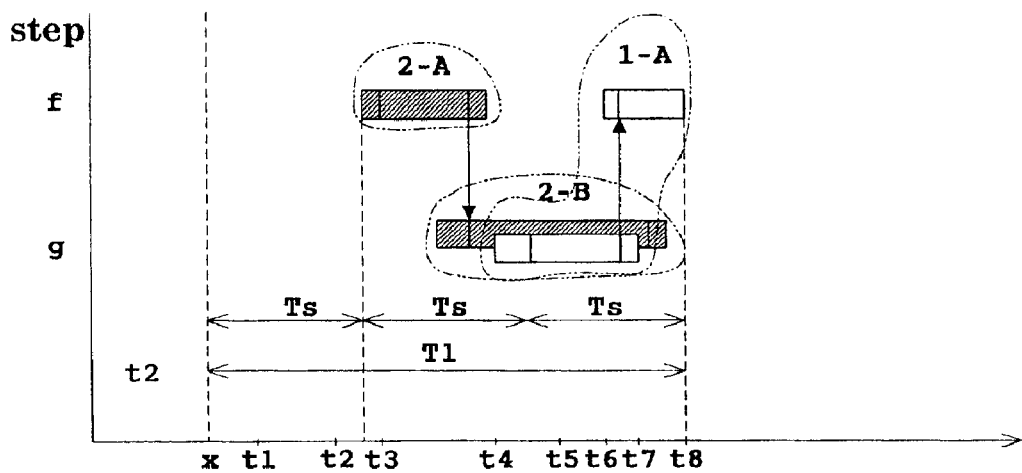

FIG. 18 shows block A for the second lot allocated to a position separated from the scheduling reference time "x" by one step time Ts. In this case also, it will be seen that block B for the second lot subsequently allocated will conflict with the processing step "f" for the first lot. Thus, this allocation also is ineligible.

Figure 19:
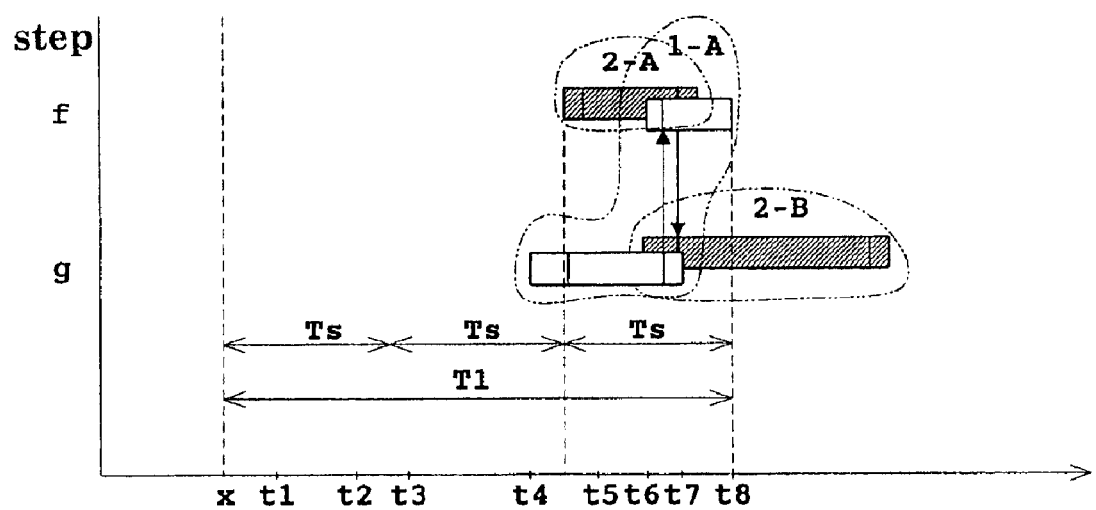

FIG. 19 shows block A for the second lot allocated to a position further separated by another step time Ts. For the above reason, this position is not suitable for allocation.

The results of the trial repeated the number of times corresponding to the predetermined value "n" indicate that no allocation is possible. Thus, the processing steps for the second lot are to be allocated to the "positive allocating position" shown in FIG. 16.

As described above, an allocation of the processing steps for the next lot is tried for the scheduling reference time "x" and each step time Ts reflecting a scheduling situation. Thus, a trial of allocation is performed broadly for each step time Ts variable with the situation. As a result, the time required for the scheduling may be shortened regardless of the situation.

The conventional method may be illustrated in a dotted line for the processing step "f" in FIG. 15. That is, a trial is repeated gradually at short time intervals from the scheduling reference time "x". This requires a long time to find a position suited for allocation.

The present invention is not limited to the above embodiment, but may be modified as follows:

(1) There is no need to adopt all of the rules described hereinbefore. For example, only the basic rule may be used, or only the basic rule and rule A may be used.

(2) The embodiment has been described exemplifying a concurrent processing of two lots. The invention is applicable also to a processing of three or more lots.

(3) The substrate processing apparatus discussed in the embodiment is constructed to perform a chemical process, a cleaning process and a drying process successively. The invention is applicable also to a substrate processing apparatus performing other processes. Such an apparatus may, for example, apply a photoresist solution to substrates, spread the solution thin by a spinning process, and form film by a baking process.

(4) The predetermined value "n" for rule C, preferably, is in the range of 5 to 20 having regard to the recipe and characteristics of the substrate processing apparatus. A smaller predetermined value "n" lengthens each step time, resulting in a shorter time taken before completion of the schedule. A larger predetermined value "n" shortens each step time, to increase accuracy of the schedule.

(5) Rule C has been described such that, after allocating a first processing step for one of the lots by the basic rule of scheduling, expected completion times of processing steps preceding the next processing steps for the lots are determined, and one of the next processing steps preceded by a processing step having the earliest expected completion time is allocated as the next processing step. However, also in a scheduling method intended for a different purpose to a reduction of processing time by the schedule prepared, rule C according to the present invention may be applied where an "overtaking" takes place as noted hereinbefore, to shorten the scheduling time.

Second Embodiment

A second embodiment of the invention will be described hereinafter with reference to the drawings.

The construction and block diagram of the substrate processing apparatus are the same as in the first embodiment described hereinbefore.

The controller 37 in this embodiment determines, in advance of actual processing, use timing of the resources, noted hereinbefore, according to a recipe and based on a procedure corresponding to a scheduling program described hereinafter. Subsequently, lots are processed with the resources according to the recipe and based on a schedule prepared.

The memory 39 stores a plurality of recipes prepared beforehand by the user of the substrate processing apparatus and instructing how the lots should be processed, a scheduling program described hereinafter, and a processing program for executing the schedule prepared.

A treating solution including chemicals is used in the chemical processing units 23 and 31. The treating solution has a "lifetime" based on use time of the treating solution and a "life count" based on use frequency of the treating solution. In preparing the schedule, the controller 37 first allocates solution change plans by the lifetime, and then allocate lot processing steps (i.e. use timing of each resource). When the life count is up, the lifetime allocated thereafter is canceled and a solution change plan is allocated immediately after the expiry of the life count. After reallocating the solution change plan according to the lifetime, the processing steps for each lot are allocated. This is the characterizing feature of the second embodiment.

Next, the procedure corresponding to the scheduling program will be described with reference to the time charts of FIGS. 20 through 24 showing scheduling stages. To facilitate understanding, the recipe illustrated is a simplified version of an actual recipe.

Specifically, the recipe includes:

block A having the processing steps using the second transport mechanism 13, deionized water cleaning unit 29, chemical processing unit 31 and deionized water cleaning unit 29 as the resources;

block B having the processing steps using the deionized water cleaning unit 21 and chemical processing unit 23 and deionized water cleaning unit 21 as the resources; and block C having the processing steps using the drying unit 17 and second transport mechanism 13.

The third transport mechanism 15, first auxiliary transport mechanism 25 and second auxiliary transport mechanism 33 acting as the resource are omitted from this recipe.

Although a processing time is determined beforehand for a process in each processing section, no problem may arise from a certain standby period from the end of the process to a next processing step. In a transporting process by the second transport mechanism 13, for example, wafers W may be put on standby after being taken out of a cassette 1. In a cleaning process, wafers W may stand by in deionized water. In a drying process by the drying unit 17, there is no problem in leaving dried wafers W on standby. The above recipe includes nine processing steps, part of which is executed a plurality of times. The whole processing is divided into three blocks A–C by the processing steps allowing standby periods as noted above.

Figure 20:
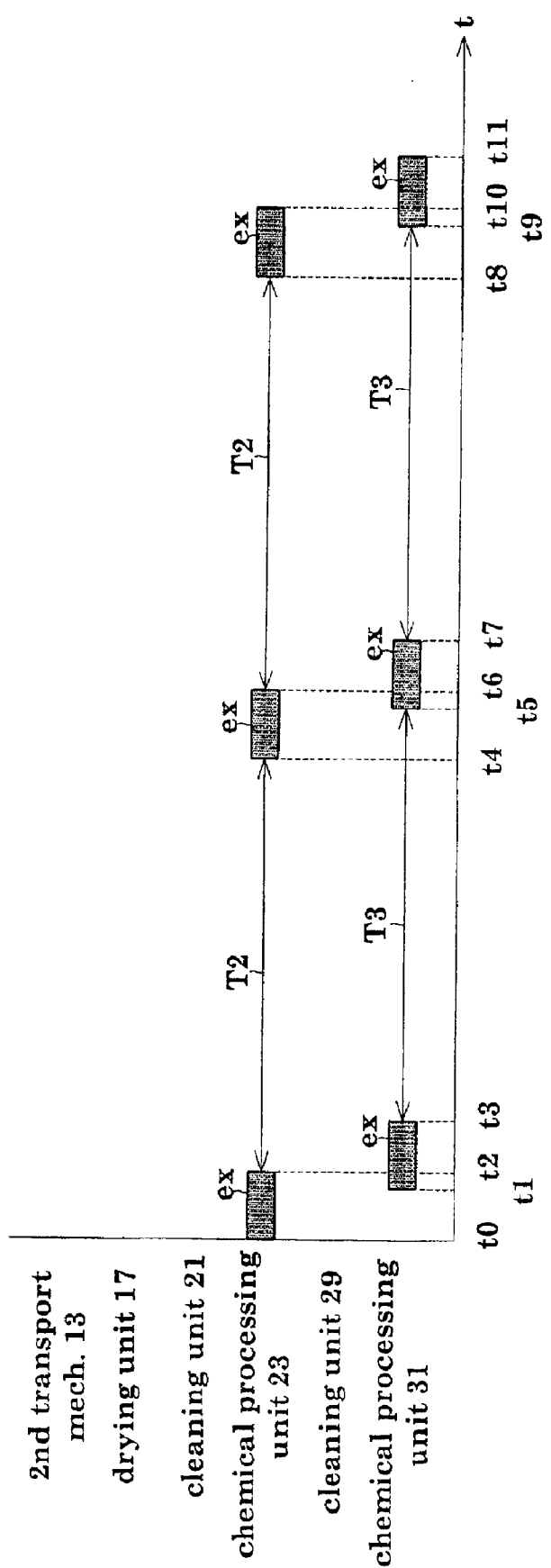
FIGS. 20 through 24 are time charts showing scheduling stages in a second embodiment.

Before allocating the processing steps for the lots, solution change plans "ex" are allocated based the lifetime of the treating solution. Specifically, as shown in FIG. 20, a solution change plan "ex" is allocated to time t0-t2 for the chemical processing unit 23 acting as a resource. Another solution change plan "ex" is allocated to time t4-t6 after a period of time T2 corresponding to the lifetime. An additional solution change plan "ex" is allocated to time t8-t10 after a further period of time T2. Similarly, solution change plans "ex" are allocated to time t1-t3, time t5-t7 and time t9-t11 for the chemical processing unit 31 based on the lifetime of the treating solution. The intervals thereof are periods of time T3 corresponding to the lifetime. The life count is regarded as "up" when "3" is reached, that is a predetermined value is reached when the treating solution is used three times.

Figure 21:
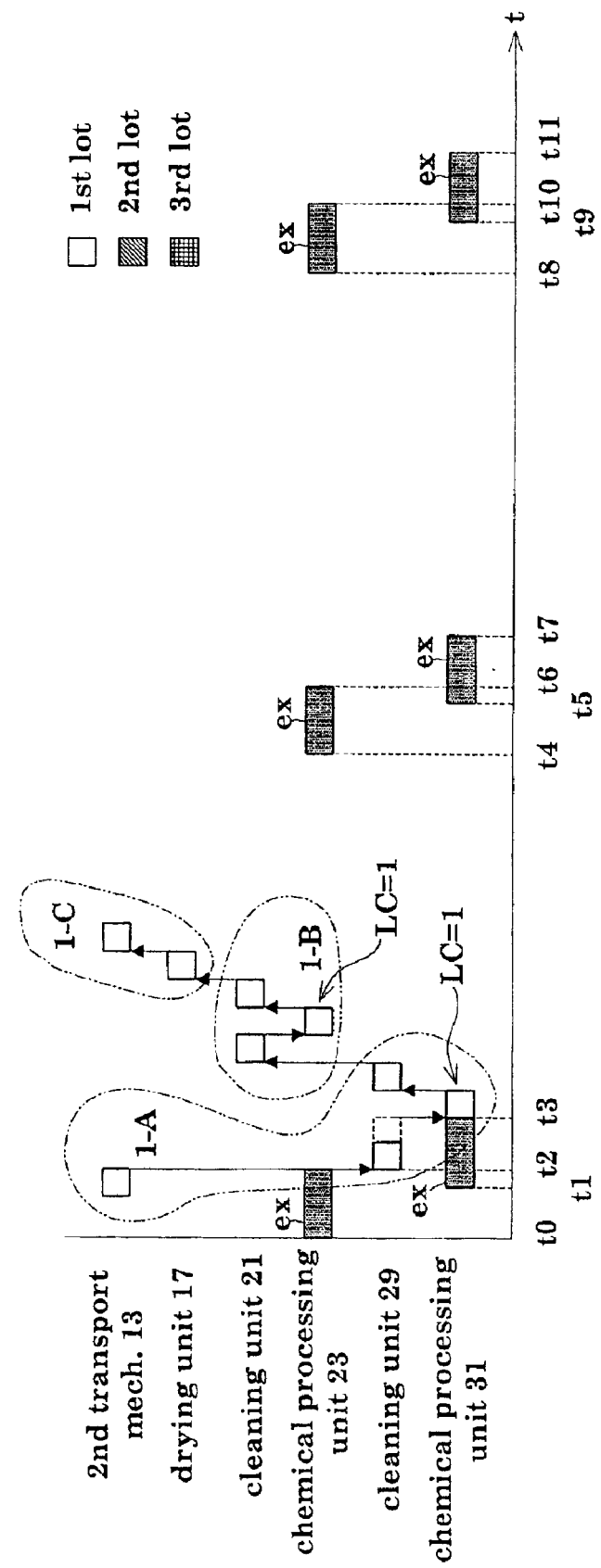

Next, as shown in FIG. 21, block A for the first lot (referenced 1-A to distinguish from other lots), and then block B (1-B) and block C (1-C) for the first lot, are allocated not to overlap the solution change plans "ex". At this time, since a solution change plan "ex" is allocated for the chemical processing unit 31, a waiting time (shown in a dotted line) occurs in the deionized water cleaning unit 29. At this point of time, life count LC is "1" for both chemical processing unit 23 and chemical processing unit 31.

Figure 22:
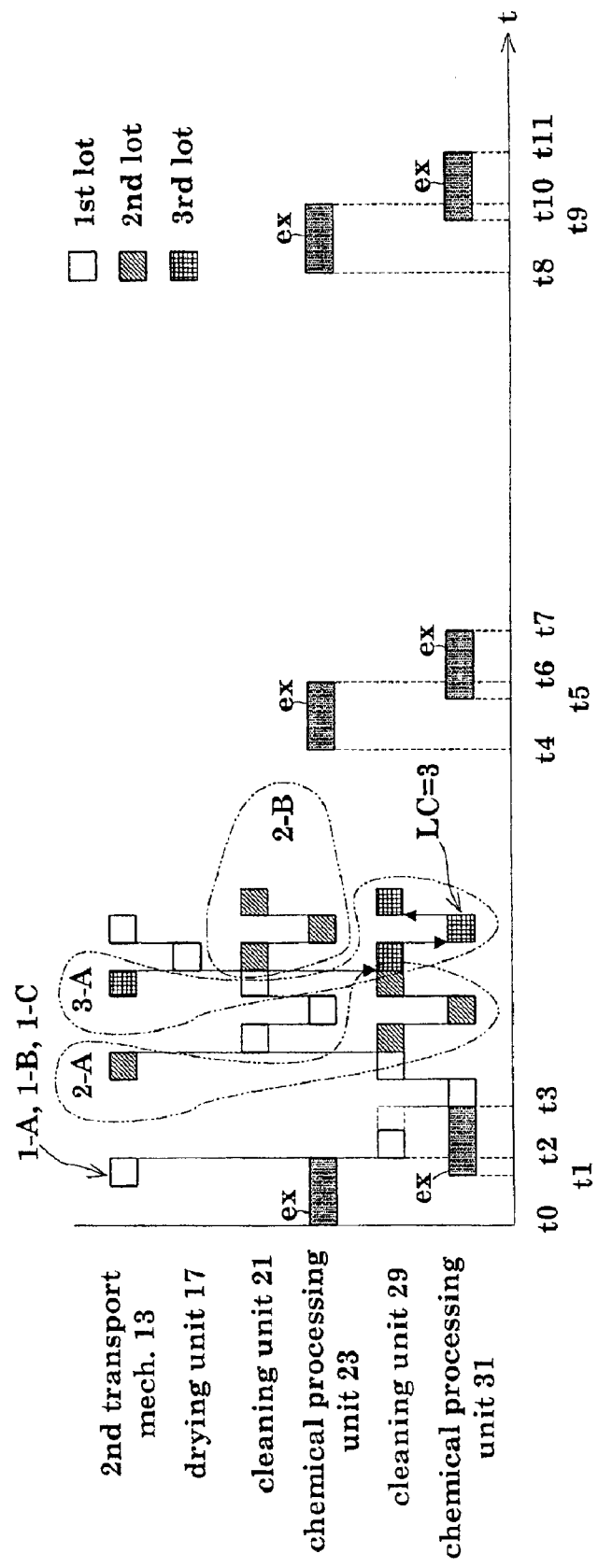

Next, as shown in FIG. 22, block A and block B for the second lot (2-A and 2-B) and block A for the third lot (3-A) are allocated. At this point of time, life count LC is up at "3" for the chemical processing unit 31 only.

Figure 23:
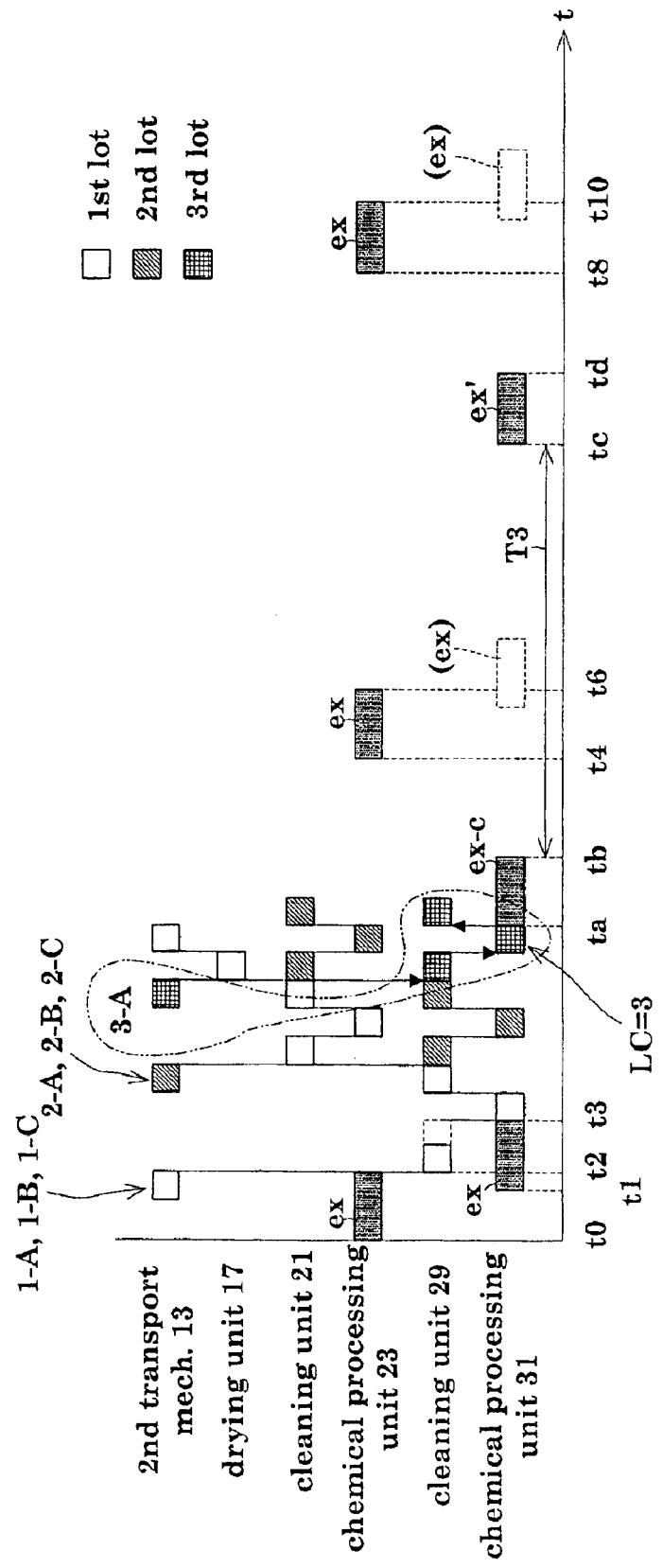

The life count is up (LC=3) for the chemical processing unit 31 when block A for the third lot (3-A) is allocated. Thus, as shown in FIG. 23, the solution change plans "ex" based on the lifetime and allocated thereafter are once canceled (as shown in dotted lines). A new solution change plan ex-c according to the life count is allocated to time ta-tb immediately after the expiry of the life count. Further, new solution change plan ex' is allocated a period of time T3 from the solution change plan ex-c.

Figure 24:
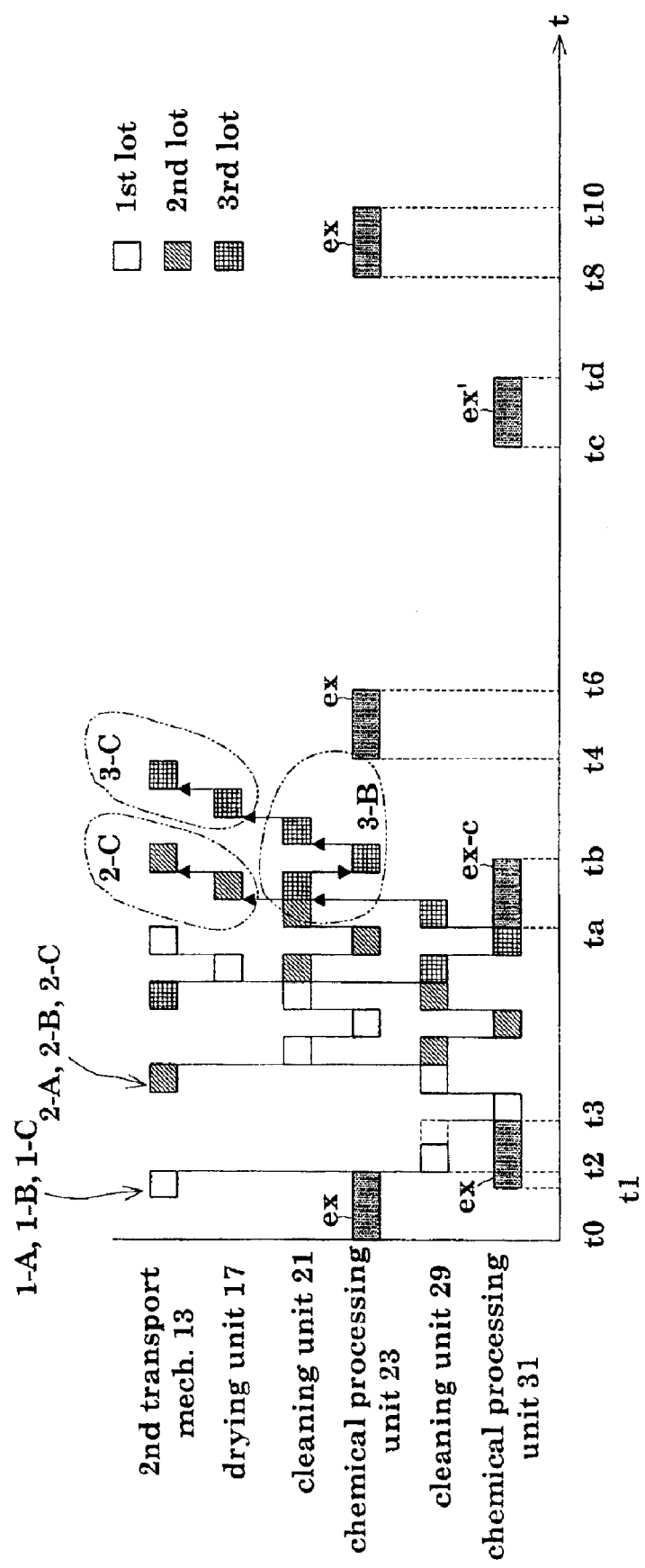

The remaining blocks for the second lot and third lot are allocated as shown in FIG. 24. Specifically, block C for the second lot (2-C) and block B for the third lot (3-B) are allocated, and then block C for the third lot (3-C) is allocated.

The schedule prepared beforehand in this way is stored in the memory 39. The controller 37 controls each resource according to the schedule actually to process the lots including wafers W.

Thus, the treating solution may be changed faithfully to its lifetime by allocating the solution change plans "ex" according to the lifetime in advance and allocating the blocks for each lot, i.e. use timing of each resource for each lot, so as to fill the intervals between the solution change plans "ex". When the life count expires in the course of allocating the blocks for the lots, subsequent solution change plans "ex" according to the lifetime are canceled, and the solution change plan ex-c is allocated immediately after the expiry of the life count. Thus, the schedule may be prepared to change the treating solution immediately after the expiry of the life count. The solution may be changed accurately by allocating changing of the solution with priority.

In this embodiment, the lots are allocated in units of the blocks including a plurality of processing steps. By using such units for allocation, the schedule may be prepared efficiently without the units being too small as when each processing step is used or too large as when each recipe is used. However, the present invention may adopt an allocation based on units of the processing steps or recipes.

In preparing a schedule by the above scheduling procedure in advance, it is desirable to consider the following two points additionally:

<Additional Process 1>

Figure 25A:
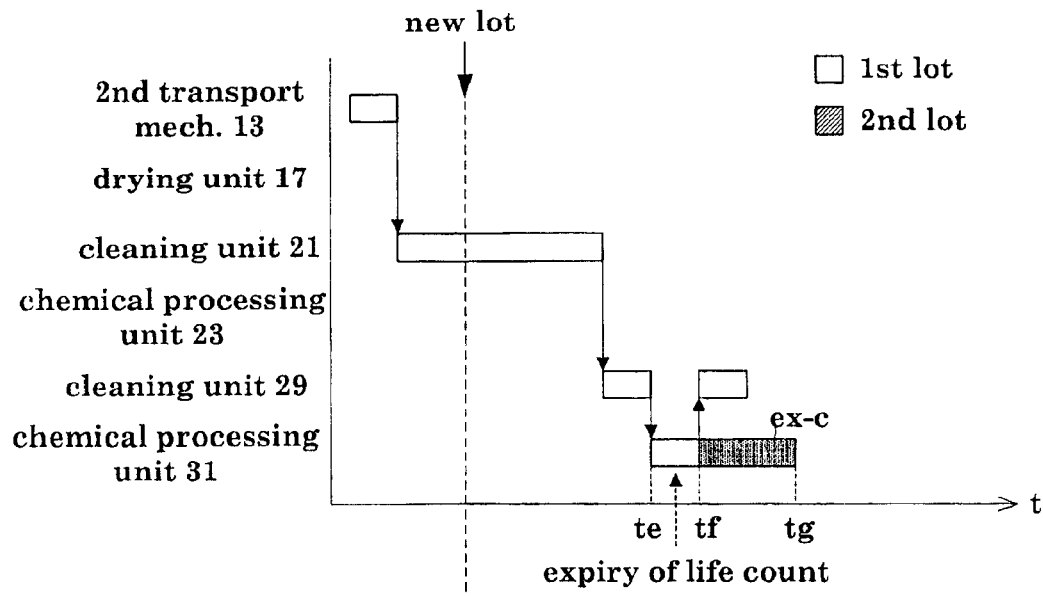
FIGS. 25A and 25B are time charts showing an additional process 1 in the scheduling stages.

The time chart of FIG. 25A refers.

Assume that a schedule has been prepared in which the blocks for the first lot include the processing steps by the second transport mechanism 13, deionized water cleaning unit 21, deionized water cleaning unit 29, chemical processing unit 31 and deionized water cleaning unit 29, and the process by the chemical processing unit 31 is started at time "te". Assume also that the life count for the chemical processing unit 31 expires as a result. Thus, based on the above scheduling method, a solution change plan ex-c is allocated to time tf-tg immediately after the processing step by the chemical processing unit 31.

Figure 25B:
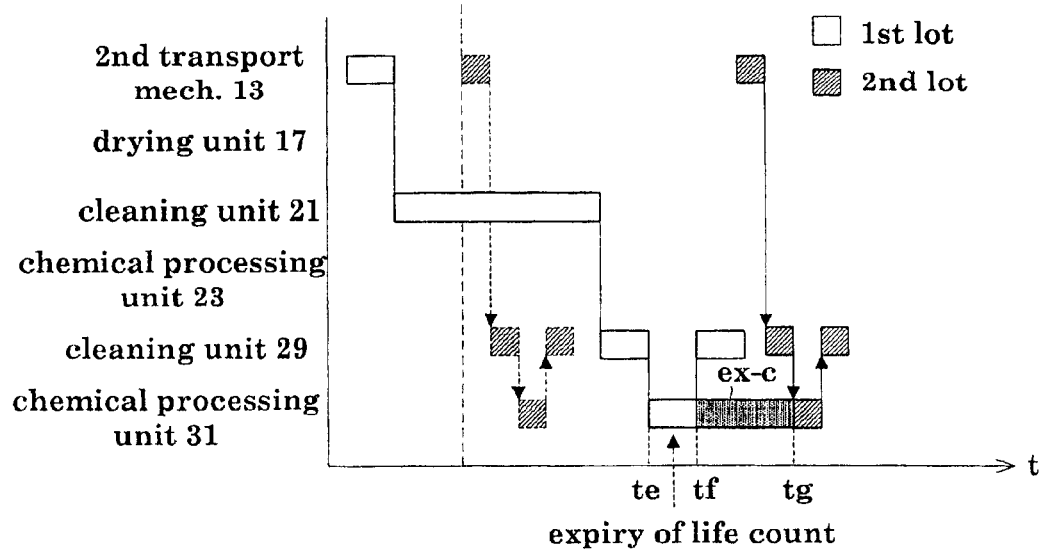

Assume that a new lot (the second lot) is introduced at a time indicated by an arrow. In this case, depending on the recipe for the new lot, as shown in a dotted line rectangle in the time chart of FIG. 25B, a process for the lot by the chemical processing unit 31 may be allocated before the solution change plan ex-c. In this case, however, a chemical process carried out after the expiry of the life count would disrupt the life count of the new chemical solution.

Thus, a rule is applied here that, once a life count is up and the solution change plan ex-c is allocated, a lot is not to be allocated before the solution change plan ex-c. Consequently, the process for the new lot by the chemical processing unit 31 is allocated after and adjacent the solution change plan ex-c. This prevents an overshoot of the life count, and enable a proper scheduling.

<Additional Process 2>

Figure 26A:
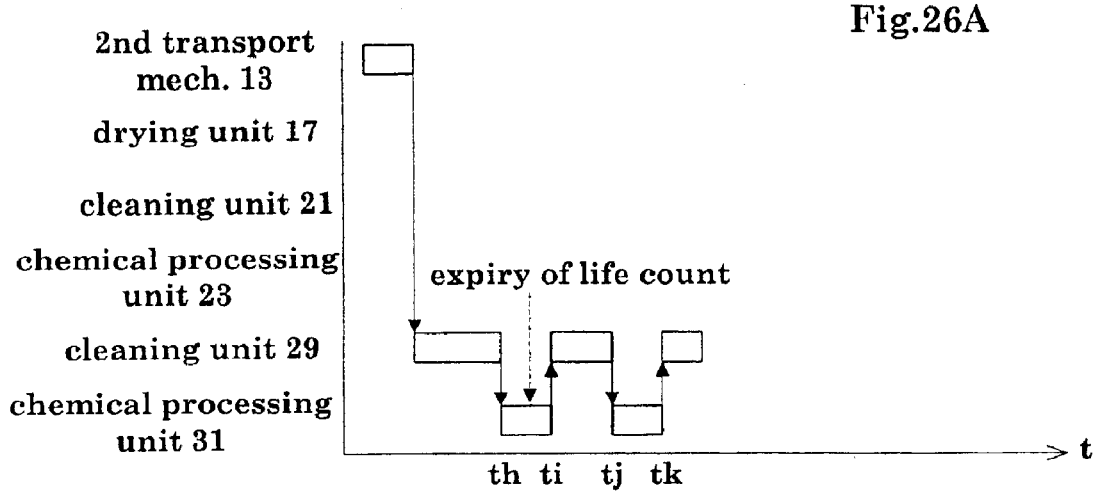
FIGS. 26A–C are time charts showing an additional process 2 in the scheduling stages.

The time chart of FIG. 26A refers.

Blocks for this lot include the processing steps by the second transport mechanism 13, deionized water cleaning unit 29, chemical processing unit 31, deionized water cleaning unit 29, chemical processing unit 31 and deionized water cleaning unit 29.

Usually, when a chemical process is performed twice, a deionized water cleaning process may be interposed in between with the lot allowed to stand by after the cleaning process. It is therefore conceivable to schedule the processes as divided into smaller blocks. However, in some processing situations, the chemical process must be performed twice (or more) within a specified time.

Figure 26B:
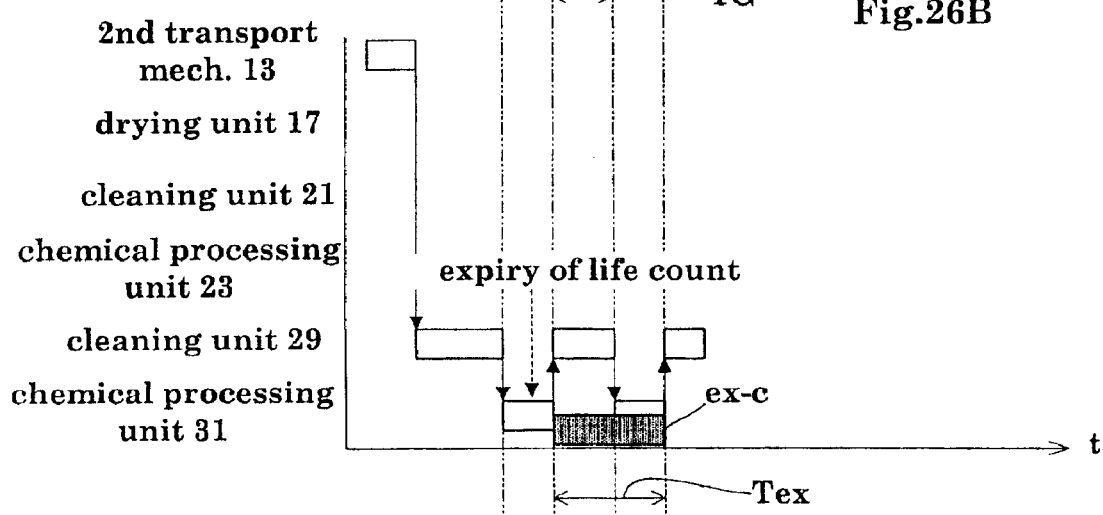

Assume, in such a case, that a chemical process is performed in the chemical processing unit 31 for a period of time th-ti, a cleaning process in the deionized water cleaning unit 29 for a period of time ti-tj, and a chemical process again in the chemical processing unit 31 for a period of time tj-tk after a time TG from the first chemical process, and that the life count expires during the first chemical process. Furthermore, it is assumed that, as shown in FIG. 26B, the time TG, which corresponds to an interval between uses of the chemical solution, is shorter than a time Tex required for a solution change plan ex-c, and therefore the solution change plan ex-c cannot be allocated immediately after the expiry of the life count.

Figure 26C:
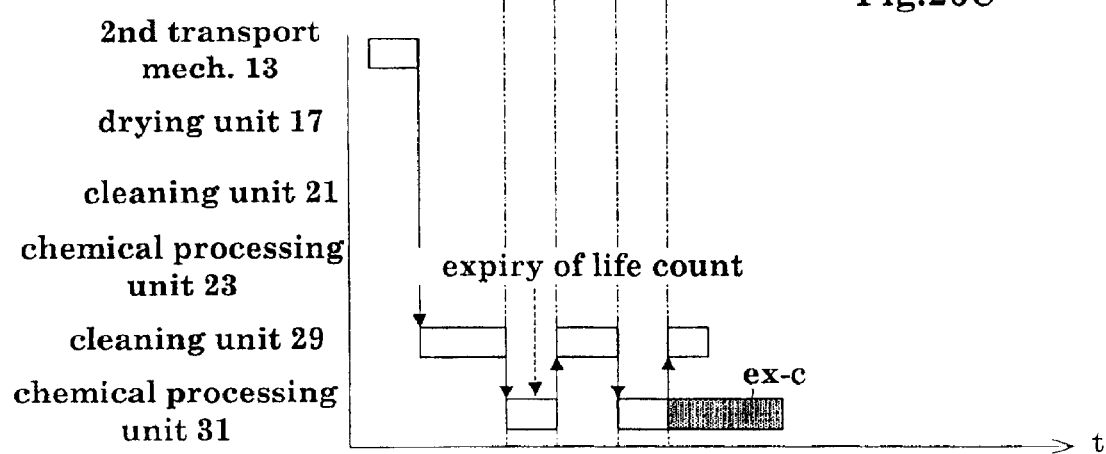

In this case, as shown in the time chart of FIG. 26C, the solution change plan ex-c is allocated to a point of time tk when the subsequent chemical process ends. As a result, the treating solution may be changed as soon as possible even where, because of the recipe, the solution cannot be changed accurately based on the expiry of the life count. Thus, the solution may be changed substantially accurately based on the expiry of the life count while processing the lot faithfully to the recipe.

The present invention is applicable wherever a schedule is prepared beforehand, and then actual processes are performed. The scheduling method in the first embodiment is particularly preferred. The processing steps in this method may be in the form of blocks.

That is, in a method of preparing a schedule for a substrate processing apparatus, wherein a plurality of lots are processed by the substrate processing apparatus including a plurality of processing sections for processing substrates, an order of processing the lots being determined based on a recipe including a plurality of processing steps for successively processing in the processing sections; a first processing step for one of the lots is allocated, and thereafter one of next processing steps for the lots preceded by a processing step having an earliest expected completion time is allocated as a next processing step.

With this method by scheduling in advance, a subsequent operation in the preceding processing step and a preliminary operation in the succeeding processing step may be overlapped. By selecting and allocating one of allocable processing steps preceded by a processing step completed early, as the next processing step, this next processing step may be completed in a reduced time. Thus, effectively use is made of each processing section of the substrate processing apparatus and the standby time is reduced to improve time efficiency.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of preparing a schedule for a substrate processing apparatus, wherein a plurality of lots are processed by said substrate processing apparatus including a plurality of processing sections, an order of processing said lots being determined based on a recipe including a plurality of processing steps for processing said lots in said processing sections, said method comprising, in determining said order:
   a step of allocating a first processing step for one of said lots, and thereafter allocating, as a next processing step, one of next processing steps for said lots preceded by a processing step having an earliest expected completion time;
   wherein said one of next processing steps for said lots preceded by a processing step having said earliest expected completion time is prevented from being allocated after a processing step already allocated and having an expected transfer time remaining open, said expected transfer time being a time at which a processed lot is transferred.

2. A method as defined in claim 1, wherein, when said recipe includes a processing step having a permissible time stipulated as a maximum standby time after a process in one of the processing sections until a next processing step, the next processing step is allocated after the processing step having said permissible time to be within said permissible time.

3. A method as defined in claim 1, wherein, when a processing step for one of said lots allocated later overtakes and precedes in time a processing step for a different lot allocated earlier, said processing step overtaking is allocated with priority.

4. A method as defined in claim 2, wherein, when a processing step for one of said lots allocated later overtakes and precedes in time a processing step for a different lot allocated earlier, said processing step overtaking is allocated with priority.

5. A method as defined in claim 1, wherein said plurality of processing sections include a chemical processing unit and a deionized water cleaning unit.

6. A method as defined in claim 1, wherein said processing step having said permissible time is a deionized water cleaning process.

7. A method as defined in claim 1, wherein said processing step having said permissible time is a drying process.

8. A program for preparing a schedule for a substrate processing apparatus, wherein a plurality of lots are processed by said substrate processing apparatus including a plurality of processing sections, an order of processing said lots being determined based on a recipe including a plurality of processing steps for processing said lots in said processing sections, said program comprising, in determining said order:
   a step of controlling a computer to allocate a first processing step for one of said lots, and thereafter to allocate, as a next processing step, one of next processing steps for said lots preceded by a processing step having an earliest expected completion time;
   wherein said one of next processing steps for said lots preceded by a processing step having said earliest expected completion time is prevented from being allocated after a processing step already allocated and having an expected transfer time remaining open, said expected transfer time being a time at which a processed lot is transferred.

9. A method of preparing a schedule for a substrate processing apparatus, wherein a plurality of lots are processed by said substrate processing apparatus including a plurality of processing sections, an order of processing said lots being determined, before an actual processing, based on a recipe including a plurality of processing steps for processing said lots in said processing sections, said method comprising, in determining said order:
   when a first processing step for one of said lots is allocated and thereafter a processing step for a next lot is allocated, and a processing step for said next lot allocated later overtakes and precedes in time a processing step for said one of said lots allocated earlier, subsequent processing steps of said next lot becoming impossible to allocate;
   a step of determining an allocating position to which each processing step for said next lot is allocable, regarding said allocating position as a positive allocating position, determining, as a scheduling time difference, a difference between a time of said positive allocating position and a scheduling reference time of a scheduling reference position for processing steps being allocated, obtaining step times by dividing said scheduling time difference by a predetermined value, and trying an allocation of each processing step for said next lot for each of said step times starting with said scheduling reference time; and wherein said predetermined value is a range of 5 to 20.

10. A method as defined in claim 9, wherein processing steps for said one of said lots allocated earlier remain fixed.

11. A method as defined in claim 9, wherein, when allocating a next processing step for said lots, one of the next processing steps for said lots preceded by a processing step having an earliest expected completion time is allocated as the next processing step.

12. A method as defined in claim 10 wherein, when allocating a next processing step for said lots, one of the next processing steps for said lots preceded by a processing step having an earliest expected completion time is allocated as the next processing step.

13. A program for preparing a schedule for a substrate processing apparatus, wherein a plurality of lots are processed by said substrate processing apparatus including a plurality of processing sections, an order of processing said lots being determined, before an actual processing, based on a recipe including a plurality of processing steps for processing said lots in said processing sections, said program comprising, in determining said order:

when a first processing step for one of said lots is allocated and thereafter a processing step for a next lot is allocated, and a processing step for said next lot allocated later overtakes and precedes in time a processing step for said one of said lots allocated earlier, subsequent processing steps of said next lot becoming impossible to allocate;

a step of controlling a computer to determine an allocating position to which each processing step for said next lot is allocable, to regard said allocating position as a positive allocating position, to determine, as a scheduling time difference, a difference between a time of said positive allocating position and a scheduling reference time of a scheduling reference position for processing steps being allocated, to obtain step times by dividing said scheduling time difference by a predetermined value, and to try an allocation of each processing step for said next lot for each of said step times starting with said scheduling reference time;

wherein said predetermined value is a range of 5 to 20.

14. A method of preparing a schedule for a substrate processing apparatus, said substrate processing apparatus including a plurality of processing sections, use timing of resources in said processing sections being determined to process said plurality of lots with said resources, said method comprising:

with a view to using said processing sections based on a lifetime determining life of said treating solution from use time of said treating solution in one of said processing sections and a life count determining life of said treating solution from use frequency of said treating solution in said one of said processing sections;

a step of allocating solution change plans according to the lifetime to said resources in said processing sections before starting an actual processing, thereafter allocating times for using each of said resources for each of said lots, and when said life count expires, canceling those of the solution change plans according to the lifetime already allocated after expiry of said life count, allocating a solution change plan immediately after the expiry of said life count, and thereafter allocating times for using each of said resources for each of said lots again;

wherein, after allocating said solution change plan following the expiry of said life count, use for a next lot of a processing section for which said treating solution is changed is prevented from being allocated before said solution change plan.

15. A method as defined in claim 14, wherein, when said life count expires and an interval between uses for a lot of a processing section for which said treating solution is changed is shorter than a time required for changing of said treating solution, a solution change plan is allocated after completion of use for said lot of said processing section.

16. A method as defined in claim 14, wherein said times for using each of said resources for each of said lots are allocated based on a recipe including a plurality of processing steps, and in units of blocks divided by certain of said processing steps allowing said lots to stand by after processing.

17. A method as defined in claim 15, wherein said times for using each of said resources for each of said lots are allocated based on a recipe including a plurality of processing steps, and in units of blocks divided by certain of said processing steps allowing said lots to stand by after processing.

18. A program for preparing a schedule for a substrate processing apparatus, said substrate processing apparatus including a plurality of processing sections, use timing of resources in said processing sections being determined to process said plurality of lots with said resources, said program comprising:

with a view to using said processing sections based on a lifetime determining life of said treating solution from use time of said treating solution in said processing sections and a life count determining life of said treating solution from use frequency of said treating solution in said processing sections;

a step of controlling a computer to allocate solution change plans according to the lifetime to said resources in said processing sections before starting an actual processing, thereafter to allocate times for using each of said resources for each of said lots, and when said life count expires, to cancel those of the solution change plans according to the lifetime already allocated after expiry of said life count, to allocate a solution change plan immediately after the expiry of said life count, and thereafter to allocate times for using each of said resources for each of said lots again;

wherein, after allocating said solution change plan following the expiry of said life count, use for a next lot of a processing section for which said treating solution is changed is prevented from being allocated before said solution change plan.

* * * * *